United States Patent
Donovan et al.

(10) Patent No.: US 11,513,195 B2
(45) Date of Patent: Nov. 29, 2022

(54) EYE-SAFE LONG-RANGE SOLID-STATE LIDAR SYSTEM

(71) Applicant: OPSYS Tech Ltd., Holon (IL)

(72) Inventors: Mark J. Donovan, Mountain View, CA (US); Larry Fabiny, Boulder, CO (US)

(73) Assignee: OPSYS Tech Ltd., Holon (IL)

( * ) Notice: Subject to any disclaimer, the term of this patent is extended or adjusted under 35 U.S.C. 154(b) by 324 days.

(21) Appl. No.: 16/895,588

(22) Filed: Jun. 8, 2020

(65) Prior Publication Data
US 2020/0386868 A1    Dec. 10, 2020

Related U.S. Application Data

(60) Provisional application No. 62/859,349, filed on Jun. 10, 2019.

(51) Int. Cl.
| | | |
|---|---|---|
| G01S 7/481 | (2006.01) | |
| G01S 17/10 | (2020.01) | |
| G01S 17/931 | (2020.01) | |

(52) U.S. Cl.
CPC .......... *G01S 7/4817* (2013.01); *G01S 7/4815* (2013.01); *G01S 7/4816* (2013.01); *G01S 17/10* (2013.01); *G01S 17/931* (2020.01)

(58) Field of Classification Search
CPC .... G01S 7/4817; G01S 7/4815; G01S 7/4816; G01S 17/10; G01S 17/931; G01S 7/484; G01S 7/4865; G01S 17/89; G01S 7/4811; G01S 17/08
See application file for complete search history.

(56) References Cited

U.S. PATENT DOCUMENTS

| | | | |
|---|---|---|---|
| 5,157,257 A | 10/1992 | Geiger | |
| 5,552,893 A | 9/1996 | Akasu | |
| 5,909,296 A | 6/1999 | Tsacoyeanes | |
| 6,057,909 A | 5/2000 | Yahav et al. | |

(Continued)

FOREIGN PATENT DOCUMENTS

| | | |
|---|---|---|
| CN | 1512946 A | 7/2004 |
| CN | 101013030 A | 8/2007 |

(Continued)

OTHER PUBLICATIONS

"Notification of Transmittal of the International Search Report and the Written Opinion of the International Searching Authority, or the Declaration" for PCT/US2020/036634, dated Sep. 21, 2020, 9 pages, ISA/KR, Korean Intellectual Property Office, Daejeong, Republic of Korea.

(Continued)

*Primary Examiner* — Jared Walker
(74) *Attorney, Agent, or Firm* — Rauschenbach Patent Law Group, LLC; Kurt Rauschenbach

(57) ABSTRACT

A solid-state LIDAR system includes a plurality of lasers, each generating an optical beam having a FOV when energized. A plurality of detectors is positioned in an optical path of the optical beams generated by the plurality of lasers. A FOV of at least one of the plurality of optical beams generated by the plurality of lasers overlaps a FOV of at least two of the plurality of detectors. A controller is configured to generate bias signals at a plurality of laser control outputs that energize a selected group of the plurality of lasers in a predetermined time sequence and is configured to detect a predetermined sequence of detector signals generated by the plurality of detectors.

56 Claims, 13 Drawing Sheets

(56) References Cited

U.S. PATENT DOCUMENTS

| | | |
|---|---|---|
| 6,061,001 A | 5/2000 | Sugimoto |
| 6,353,502 B1 | 3/2002 | Marchant et al. |
| 6,680,788 B1 | 1/2004 | Roberson et al. |
| 6,717,972 B2 | 4/2004 | Steinle et al. |
| 6,775,480 B1 | 8/2004 | Goodwill |
| 6,788,715 B1 | 9/2004 | Leeuwen et al. |
| 6,829,439 B1 | 12/2004 | Sidorovich et al. |
| 6,860,350 B2 | 3/2005 | Beuhler et al. |
| 6,888,871 B1 | 5/2005 | Zhang et al. |
| 7,065,112 B2 | 6/2006 | Ghosh et al. |
| 7,110,183 B2 | 9/2006 | von Freyhold et al. |
| 7,544,945 B2 | 6/2009 | Tan et al. |
| 7,652,752 B2 | 1/2010 | Fetzer et al. |
| 7,702,191 B1 | 4/2010 | Geron et al. |
| 7,746,450 B2 | 6/2010 | Willner et al. |
| 7,773,204 B1 | 8/2010 | Nelson |
| 7,969,558 B2 | 6/2011 | Hall |
| 8,072,581 B1 | 12/2011 | Breiholz |
| 8,115,909 B2 | 2/2012 | Behringer et al. |
| 8,247,252 B2 | 8/2012 | Gauggel et al. |
| 8,301,027 B2 | 10/2012 | Shaw et al. |
| 8,576,885 B2 | 11/2013 | van Leeuwen et al. |
| 8,675,181 B2 | 3/2014 | Hall |
| 8,675,706 B2 | 3/2014 | Seurin et al. |
| 8,783,893 B1 | 7/2014 | Seurin et al. |
| 8,824,519 B1 | 9/2014 | Seurin et al. |
| 9,038,883 B2 | 5/2015 | Wang et al. |
| 9,048,633 B2 | 6/2015 | Gronenborn et al. |
| 9,268,012 B2 | 2/2016 | Ghosh et al. |
| 9,285,477 B1 | 3/2016 | Smith et al. |
| 9,348,018 B2 | 5/2016 | Eisele et al. |
| 9,360,554 B2 | 6/2016 | Retterath et al. |
| 9,378,640 B2 | 6/2016 | Mimeault et al. |
| 9,392,259 B2 | 7/2016 | Borowski |
| 9,516,244 B2 | 12/2016 | Borowski |
| 9,520,696 B2 | 12/2016 | Wang et al. |
| 9,553,423 B2 | 1/2017 | Chen et al. |
| 9,560,339 B2 | 1/2017 | Borowski |
| 9,574,541 B2 | 2/2017 | Ghosh et al. |
| 9,575,184 B2 | 2/2017 | Gilliland et al. |
| 9,658,322 B2 | 5/2017 | Lewis |
| 9,674,415 B2 | 6/2017 | Wan et al. |
| 9,791,557 B1 | 10/2017 | Wyrwas et al. |
| 9,841,495 B2 | 12/2017 | Campbell et al. |
| 9,857,468 B1 | 1/2018 | Eichenholz et al. |
| 9,933,513 B2 | 4/2018 | Dussan et al. |
| 9,946,089 B2 | 4/2018 | Chen et al. |
| 9,989,406 B2 | 6/2018 | Pacala et al. |
| 9,989,629 B1 | 6/2018 | LaChapelle |
| 9,992,477 B2 | 6/2018 | Pacala et al. |
| 10,007,001 B1 | 6/2018 | LaChapelle et al. |
| 10,063,849 B2 | 8/2018 | Pacala et al. |
| 10,191,156 B2 | 1/2019 | Steinberg et al. |
| 10,295,660 B1 | 5/2019 | McMichael et al. |
| 10,488,492 B2 | 11/2019 | Hamel et al. |
| 10,514,444 B2 | 12/2019 | Donovan |
| 10,761,195 B2 | 9/2020 | Donovan |
| 10,928,486 B2 | 2/2021 | Donovan |
| 11,016,178 B2 | 5/2021 | Donovan |
| 11,061,234 B1 | 7/2021 | Zhu et al. |
| 11,320,538 B2 | 5/2022 | Donovan et al. |
| 2002/0117340 A1 | 8/2002 | Stettner |
| 2003/0043363 A1 | 3/2003 | Jamieson et al. |
| 2003/0147652 A1 | 8/2003 | Green et al. |
| 2004/0120717 A1 | 6/2004 | Clark et al. |
| 2004/0228375 A1 | 11/2004 | Ghosh et al. |
| 2005/0025211 A1 | 2/2005 | Zhang et al. |
| 2005/0232628 A1 | 10/2005 | von Freyhold et al. |
| 2006/0132752 A1 | 6/2006 | Kane |
| 2006/0231771 A1 | 10/2006 | Lee et al. |
| 2007/0024849 A1 | 2/2007 | Carrig et al. |
| 2007/0071056 A1 | 3/2007 | Chen |
| 2007/0131842 A1 | 6/2007 | Ernst |
| 2007/0177841 A1 | 8/2007 | Dazinger |
| 2007/0181810 A1 | 8/2007 | Tan et al. |
| 2008/0074640 A1 | 3/2008 | Walsh et al. |
| 2009/0027651 A1 | 1/2009 | Pack et al. |
| 2009/0140047 A1 | 6/2009 | Yu et al. |
| 2009/0273770 A1 | 11/2009 | Bauhahn et al. |
| 2009/0295986 A1 | 12/2009 | Topliss et al. |
| 2010/0046953 A1 | 2/2010 | Shaw et al. |
| 2010/0215066 A1 | 8/2010 | Mordaunt et al. |
| 2010/0271614 A1 | 10/2010 | Mburquerque et al. |
| 2010/0302528 A1 | 12/2010 | Hall |
| 2011/0176567 A1 | 7/2011 | Joseph |
| 2011/0216304 A1 | 9/2011 | Hall |
| 2013/0163626 A1 | 6/2013 | Seurin et al. |
| 2013/0163627 A1 | 6/2013 | Seurin et al. |
| 2013/0206967 A1 | 8/2013 | Shpunt et al. |
| 2013/0208256 A1 | 8/2013 | Mamidipudi et al. |
| 2013/0208753 A1 | 8/2013 | van Leeuwen et al. |
| 2014/0043309 A1 | 2/2014 | Go et al. |
| 2014/0049610 A1 | 2/2014 | Hudman et al. |
| 2014/0071427 A1 | 3/2014 | Last |
| 2014/0139467 A1 | 5/2014 | Ghosh et al. |
| 2014/0218898 A1 | 8/2014 | Seurin et al. |
| 2014/0247841 A1 | 9/2014 | Seurin et al. |
| 2014/0303829 A1 | 10/2014 | Lombrozo et al. |
| 2014/0333995 A1 | 11/2014 | Seurin et al. |
| 2014/0376092 A1 | 12/2014 | Mor |
| 2015/0055117 A1 | 2/2015 | Pennecot et al. |
| 2015/0069113 A1 | 3/2015 | Wang et al. |
| 2015/0097947 A1 | 4/2015 | Hudman et al. |
| 2015/0109603 A1 | 4/2015 | Kim et al. |
| 2015/0131080 A1 | 5/2015 | Retterath et al. |
| 2015/0160341 A1 | 6/2015 | Akatsu et al. |
| 2015/0219764 A1 | 8/2015 | Lipson |
| 2015/0255955 A1 | 9/2015 | Wang et al. |
| 2015/0260830 A1 | 9/2015 | Ghosh et al. |
| 2015/0260843 A1 | 9/2015 | Lewis |
| 2015/0311673 A1 | 10/2015 | Wang et al. |
| 2015/0340841 A1 | 11/2015 | Joseph |
| 2015/0362585 A1 | 12/2015 | Ghosh et al. |
| 2015/0377696 A1 | 12/2015 | Shpunt et al. |
| 2015/0378023 A1 | 12/2015 | Royo Royo et al. |
| 2016/0003946 A1 | 1/2016 | Gilliland et al. |
| 2016/0025842 A1 | 1/2016 | Anderson et al. |
| 2016/0033642 A1 | 2/2016 | Fluckiger |
| 2016/0072258 A1 | 3/2016 | Seurin et al. |
| 2016/0080077 A1 | 3/2016 | Joseph et al. |
| 2016/0161600 A1 | 6/2016 | Eldada et al. |
| 2016/0254638 A1 | 9/2016 | Chen et al. |
| 2016/0266242 A1 | 9/2016 | Gilliland et al. |
| 2016/0282468 A1 | 9/2016 | Gruver et al. |
| 2016/0291156 A1 | 10/2016 | Hjelmstad |
| 2016/0306358 A1 | 10/2016 | Kang et al. |
| 2016/0348636 A1 | 12/2016 | Ghosh et al. |
| 2017/0003392 A1 | 1/2017 | Bartlett et al. |
| 2017/0026633 A1 | 1/2017 | Riza |
| 2017/0059838 A1 | 3/2017 | Tilleman |
| 2017/0115497 A1 | 4/2017 | Chen et al. |
| 2017/0131387 A1 | 5/2017 | Campbell et al. |
| 2017/0131388 A1 | 5/2017 | Campbell et al. |
| 2017/0139041 A1 | 5/2017 | Drader et al. |
| 2017/0153319 A1 | 6/2017 | Villeneuve et al. |
| 2017/0168162 A1 | 6/2017 | Jungwirth |
| 2017/0176579 A1 | 6/2017 | Niclass et al. |
| 2017/0181810 A1 | 6/2017 | Tennican |
| 2017/0219426 A1 | 8/2017 | Pacala et al. |
| 2017/0256915 A1 | 9/2017 | Ghosh et al. |
| 2017/0285169 A1 | 10/2017 | Holz |
| 2017/0289524 A1 | 10/2017 | Pacala et al. |
| 2017/0299722 A1 | 10/2017 | Gong et al. |
| 2017/0307736 A1 | 10/2017 | Donovan |
| 2017/0307758 A1 | 10/2017 | Pei et al. |
| 2017/0350982 A1 | 12/2017 | Lipson |
| 2017/0353004 A1 | 12/2017 | Chen et al. |
| 2017/0356740 A1 | 12/2017 | Ansari et al. |
| 2018/0045816 A1 | 2/2018 | Jarosinski et al. |
| 2018/0058923 A1 | 3/2018 | Lipson et al. |
| 2018/0059222 A1 | 3/2018 | Pacala et al. |
| 2018/0062345 A1 | 3/2018 | Bills et al. |
| 2018/0074198 A1 | 3/2018 | Von Novak et al. |
| 2018/0107221 A1 | 4/2018 | Droz et al. |

(56) References Cited

U.S. PATENT DOCUMENTS

| | | |
|---|---|---|
| 2018/0113200 A1 | 4/2018 | Steinberg et al. |
| 2018/0113208 A1 | 4/2018 | Bergeron et al. |
| 2018/0120441 A1 | 5/2018 | Elooz et al. |
| 2018/0128920 A1 | 5/2018 | Keilaf et al. |
| 2018/0152691 A1 | 5/2018 | Pacala et al. |
| 2018/0167602 A1 | 6/2018 | Pacala et al. |
| 2018/0180720 A1 | 6/2018 | Pei et al. |
| 2018/0180722 A1 | 6/2018 | Pei et al. |
| 2018/0203247 A1 | 7/2018 | Chen et al. |
| 2018/0209841 A1 | 7/2018 | Pacala et al. |
| 2018/0217236 A1 | 8/2018 | Pacala et al. |
| 2018/0259623 A1 | 9/2018 | Donovan |
| 2018/0259624 A1 | 9/2018 | Kiehn et al. |
| 2018/0259645 A1 | 9/2018 | Shu et al. |
| 2018/0269646 A1 | 9/2018 | Welford et al. |
| 2018/0299552 A1 | 10/2018 | Shu et al. |
| 2018/0301874 A1 | 10/2018 | Burroughs et al. |
| 2018/0301875 A1 | 10/2018 | Burroughs et al. |
| 2018/0364334 A1 | 12/2018 | Xiang et al. |
| 2018/0364356 A1 | 12/2018 | Eichenholz et al. |
| 2019/0003429 A1 | 1/2019 | Miyashita |
| 2019/0004156 A1 | 1/2019 | Niclass et al. |
| 2019/0018115 A1 | 1/2019 | Schmitt et al. |
| 2019/0036308 A1 | 1/2019 | Carson et al. |
| 2019/0049662 A1 | 2/2019 | Thomsen et al. |
| 2019/0056497 A1 | 2/2019 | Pacala et al. |
| 2019/0094346 A1 | 3/2019 | Dumoulin et al. |
| 2019/0098233 A1 | 3/2019 | Gassend et al. |
| 2019/0146071 A1 | 5/2019 | Donovan |
| 2019/0170855 A1 | 6/2019 | Keller et al. |
| 2019/0179018 A1 | 6/2019 | Gunnam et al. |
| 2019/0293954 A1 | 9/2019 | Lin et al. |
| 2019/0302246 A1 | 10/2019 | Donovan et al. |
| 2020/0018835 A1 | 1/2020 | Pei et al. |
| 2020/0041614 A1 | 2/2020 | Donovan et al. |
| 2020/0081101 A1 | 3/2020 | Donovan |
| 2020/0200874 A1 | 6/2020 | Donovan |
| 2020/0209355 A1 | 7/2020 | Pacala et al. |
| 2020/0278426 A1 | 9/2020 | Dummer et al. |
| 2020/0326425 A1 | 10/2020 | Donovan et al. |
| 2020/0379088 A1 | 12/2020 | Donovan et al. |
| 2020/0386868 A1 | 12/2020 | Donovan et al. |
| 2020/0408908 A1 | 12/2020 | Donovan |
| 2021/0033708 A1 | 2/2021 | Fabiny |
| 2021/0181311 A1 | 6/2021 | Donovan |
| 2021/0231779 A1 | 7/2021 | Donovan |
| 2021/0231806 A1 | 7/2021 | Donovan et al. |
| 2021/0234342 A1 | 7/2021 | Donovan |
| 2021/0278540 A1 | 9/2021 | Maayan et al. |
| 2021/0321080 A1 | 10/2021 | Jeong et al. |
| 2022/0146680 A1 | 5/2022 | Donovan et al. |

FOREIGN PATENT DOCUMENTS

| | | |
|---|---|---|
| CN | 101080733 A | 11/2007 |
| CN | 101545582 A | 9/2009 |
| CN | 103633557 A | 3/2014 |
| CN | 104898125 A | 9/2015 |
| CN | 105705964 A | 6/2016 |
| CN | 106464366 A | 2/2017 |
| CN | 109073757 A | 12/2018 |
| CN | 107728156 B | 11/2019 |
| CN | 110402398 A | 11/2019 |
| CN | 110914702 A | 3/2020 |
| CN | 111356934 A | 6/2020 |
| CN | 111919137 A | 11/2020 |
| CN | 112543875 A | 3/2021 |
| CN | 113692540 A | 11/2021 |
| CN | 113906316 A | 1/2022 |
| CN | 113924506 A | 1/2022 |
| CN | 114096882 A | 2/2022 |
| CN | 114174869 A | 3/2022 |
| DE | 197 17 399 A1 | 6/1999 |
| DE | 10103861 A1 | 8/2001 |
| DE | 10 2007 004 609 A1 | 8/2007 |
| DE | 10 2019 005 059 A1 | 2/2020 |
| EP | 1 160 540 A1 | 12/2001 |
| EP | 1444696 B1 | 3/2005 |
| EP | 1569007 A2 | 8/2005 |
| EP | 2656099 A1 | 12/2011 |
| EP | 2656106 A1 | 12/2011 |
| EP | 2 775 316 A2 | 9/2014 |
| EP | 3168641 B1 | 4/2016 |
| EP | 3497477 A1 | 8/2016 |
| EP | 2656100 A1 | 10/2016 |
| EP | 3526625 A1 | 11/2016 |
| EP | 3 159 711 A1 | 4/2017 |
| EP | 3 446 153 A2 | 2/2019 |
| EP | 3 596 492 A1 | 1/2020 |
| EP | 3 658 949 A1 | 6/2020 |
| EP | 3 710 855 A2 | 9/2020 |
| EP | 3 775 979 A1 | 2/2021 |
| EP | 3 830 602 A1 | 6/2021 |
| EP | 3953727 A1 | 2/2022 |
| EP | 3977159 A1 | 4/2022 |
| EP | 3980808 A1 | 4/2022 |
| EP | 3990943 A1 | 5/2022 |
| EP | 4004587 A1 | 6/2022 |
| FR | 2816264 A1 | 5/2002 |
| JP | 7-253460 | 10/1995 |
| JP | 2003258359 A | 9/2003 |
| JP | 2003-536061 | 12/2003 |
| JP | 2004-94115 | 3/2004 |
| JP | 2004-361315 A | 12/2004 |
| JP | 2005-331273 A | 12/2005 |
| JP | 2007-214564 | 8/2007 |
| JP | 4108478 B2 | 6/2008 |
| JP | 2009-103529 | 5/2009 |
| JP | 2009-204691 | 9/2009 |
| JP | 2010-91855 | 4/2010 |
| JP | 2010-256291 A | 11/2010 |
| JP | 2012-504771 A | 2/2012 |
| JP | 5096008 | 12/2012 |
| JP | 2014-077658 A | 5/2014 |
| JP | 2016-146417 | 8/2016 |
| JP | 2016-188808 A | 11/2016 |
| JP | 2019-509474 A | 4/2019 |
| JP | 2019-516101 A | 6/2019 |
| JP | 2020-510208 A | 4/2020 |
| JP | 2021-503085 A | 2/2021 |
| JP | 6839861 B2 | 3/2021 |
| JP | 6865492 B2 | 4/2021 |
| JP | 2021-073462 A | 5/2021 |
| JP | 2021-073473 A | 5/2021 |
| JP | 2021-105613 A | 7/2021 |
| JP | 2021-519926 A | 8/2021 |
| JP | 2021-139918 A | 9/2021 |
| JP | 2021-532368 A | 11/2021 |
| JP | 2022-001885 A | 1/2022 |
| JP | 6995413 B2 | 1/2022 |
| JP | 2022-022361 A | 2/2022 |
| JP | 2022-036224 A | 3/2022 |
| JP | 7037830 B2 | 3/2022 |
| JP | 2022-526998 A | 5/2022 |
| KR | 10-2014-0138724 | 12/2014 |
| KR | 10-2015-0045735 A | 4/2015 |
| KR | 10-2018-0049937 A | 5/2018 |
| KR | 10-2018-0064969 A | 6/2018 |
| KR | 10-2018-0128447 A | 12/2018 |
| KR | 10-2019-0076725 A | 7/2019 |
| KR | 10-2019-0120403 A | 10/2019 |
| KR | 10-2020-0011351 A | 2/2020 |
| KR | 10-2020-0075014 A | 6/2020 |
| KR | 10-2020-0128435 A | 11/2020 |
| KR | 10-2021-0021409 A | 2/2021 |
| KR | 10-2218679 B1 | 2/2021 |
| KR | 10-2021-0029831 A | 3/2021 |
| KR | 10-2021-0065207 A | 6/2021 |
| KR | 10-2021-0137584 A | 11/2021 |
| KR | 10-2021-0137586 A | 11/2021 |
| KR | 102326493 B1 | 11/2021 |
| KR | 102326508 B1 | 11/2021 |
| KR | 10-2022-0003600 A | 1/2022 |
| KR | 10-2022-0017412 A | 2/2022 |

(56) References Cited

FOREIGN PATENT DOCUMENTS

| | | |
|---|---|---|
| KR | 102364531 B1 | 2/2022 |
| KR | 10-2022-0024177 A | 3/2022 |
| KR | 10-2022-0025924 A | 3/2022 |
| KR | 10-2022-0038691 A | 3/2022 |
| WO | 99-42856 A1 | 8/1999 |
| WO | 2002/065153 A1 | 8/2002 |
| WO | 2006/044758 A2 | 4/2006 |
| WO | 2013107709 A1 | 7/2013 |
| WO | 2014/014838 A2 | 1/2014 |
| WO | 2015040671 | 3/2015 |
| WO | 2017/112416 A1 | 6/2017 |
| WO | 2017/132704 A1 | 8/2017 |
| WO | 2017/184336 A2 | 10/2017 |
| WO | 2018028795 A1 | 2/2018 |
| WO | 2018082762 A1 | 5/2018 |
| WO | 2018/169758 A1 | 9/2018 |
| WO | 2018166609 A1 | 9/2018 |
| WO | 2018166610 A1 | 9/2018 |
| WO | 2018166611 A1 | 9/2018 |
| WO | 2018169758 | 9/2018 |
| WO | 2019/022941 A1 | 1/2019 |
| WO | 2019-064062 A1 | 4/2019 |
| WO | 2019115148 A1 | 6/2019 |
| WO | 2019/195054 A1 | 10/2019 |
| WO | 2019/221776 A2 | 11/2019 |
| WO | 2020/028173 A1 | 2/2020 |
| WO | 2020/210176 A1 | 10/2020 |
| WO | 2020/242834 A1 | 12/2020 |
| WO | 2020/251891 A1 | 12/2020 |
| WO | 2020/263735 A1 | 12/2020 |
| WO | 2021/021872 A1 | 2/2021 |
| WO | 2021/150860 A1 | 7/2021 |
| WO | 2021/236201 A2 | 11/2021 |
| WO | 2022/103778 A1 | 5/2022 |
| WO | 2022-534500 A1 | 8/2022 |

OTHER PUBLICATIONS

"Written Opinion of the International Searching Authority" for International Patent Application No. PCT/EP2016/077499, dated Feb. 14, 2017, 7 pages, The International Searching Authority.

"Search Report" for International Patent Application No. PCT/EP2016/077499, 2 pages, International Searching Authority/ EPO, Rijswijk, the Netherlands.

International Preliminary Report on Patentability received for PCT Application Serial No. PCT/US2020/036634 dated Dec. 23, 2021, 6 pages.

U.S. Appl. No. 16/841,930, filed Apr. 7, 2020, USPTO.

U.S. Appl. No. 16/878,140, filed May 19, 2020, USPTO.

International Preliminary Report on Patentability received for PCT Application Serial No. PCT /US2019/043674 dated Feb. 18, 2021, 10 pages.

International Search Report and Written Opinion received for PCT Application Serial No. PCT/US2020/026964, dated Jul. 28, 2020, 08 pages.

International Preliminary Report on Patentability received for PCT Patent Application No. PCT/US2020/026964, dated Oct. 21, 2021, 7 pages.

Non-Final Office Action received for U.S. Appl. No. 17/227,300 dated Jun. 30, 2021, 82 pages.

International Search Report and Written Opinion received for PCT Application Serial No. PCT/US2020/033630, dated Sep. 9, 2020, 09 pages.

International Search Report and Written Opinion received for PCT Application Serial No. PCT/US2020/038927, dated Oct. 7, 2020, 12 pages.

U.S. Appl. No. 16/907,732, filed Jun. 22, 2020, USPTO, 50 pages.

International Search Report and Written Opinion received for PCT Application Serial No. PCT/US2020/043979, dated Nov. 10, 2020, 07 pages.

International Search Report and Written Opinion received for PCT Application Serial No. PCT/US2021/014564, dated May 17, 2021, 08 pages.

Communication pursuant to Article 94(3) EPC received for EP Patent Application Serial No. 17786325.5 dated Dec. 17, 2021, 5 pages.

Notification of Reason for Refusal received for Korean Patent Application Serial No. 10-2021-7036648 dated Dec. 17, 2021, 8 pages. (Including English Translation).

Decision to Grant a Patent received for Korean Patent Application Serial No. 10-2020-7016928 dated Nov. 16, 2021, 3 pages (Including English Translation).

Final Office Action received for U.S. Appl. No. 16/168,054 dated Jan. 26, 2022, 46 pages.

Notice of Final Rejection received for Korean Patent Application Serial No. 10-2021-7006391 dated Oct. 22, 2021, 5 pages. (Including English Translation).

International Preliminary Report on Patentability received for PCT Application Serial No. PCT/US2020/033630 dated Dec. 9, 2021, 8 pages.

Notice of Preliminary Rejection received for Korean Patent Application Serial No. 10-2018-7030512 dated Dec. 23, 2021, 7 pages. (Including English Translation).

Notice of Allowance received for U.S. Appl. No. 17/227,300 dated Feb. 8, 2022, 39 pages.

International Search Report and Written Opinion received for PCT Application Serial No. PCT/US2021/020749 dated Jan. 3, 2022, 9 pages.

International Preliminary Report on Patentability received for PCT Application Serial No. PCT/US2020/038927 dated Jan. 6, 2022, 9 pages.

Decision to Grant a Patent received for Japanese Patent Application Serial No. 2019-549550 dated Feb. 25, 2022, 05 pages (Including English Translation).

Notification of Reason for Refusal received for Korean Application Serial No. 10-2020-7029872 dated Jan. 19, 2022, 30 pages (Including English Translation).

Extended European Search Report received for European Patent Application Serial No. 19843301.3 dated Feb. 18, 2022, 10 pages.

International Search Report and Written Opinion received for PCT Application Serial No. PCT/US2021/058687 dated Mar. 3, 2022, 11 pages.

Plant, et al., 256-Channel Bidirectional Optical Interconnect Using VCSELs and Photodiodes on CMOS, IEEE Journal of Lightwave Technology, Aug. 2001, pp. 1093-1103, vol. 19, No. 8.

Knodl, et al., Bipolar Cascade VCSEL with 130% Differential Quantum Efficiency, Annual Report 2000, Optoelectronics Department, University of ULM, pp. 11-14.

R.A. Morgan, et al., Two-Dimensional Matrix Addressed Vertical Cavity Top-Surface Emitting Laser Array Display, IEEE Photonics Technology Letters, Aug. 1994, pp. 913-917, vol. 6, No. 8.

M. Orenstein, et al., Matrix Addressable Vertical Cavity Surface Emitting Laser Array, Electronics Letters, Feb. 28, 1991, pp. 437-438, vol. 27, No. 5.

K.M. Geib, et al., Fabrication and Performance of Two-Dimensional Matrix Addressable Arrays of Integrated Vertical-Cavity Lasers and Resonant Cavity Photodetectors, IEEE Journal of Selected Topics In Quantum Electronics, Jul./Aug. 2002, pp. 943-947, vol. 8, No. 4.

Moench, et al., VCSEL Based Sensors for Distance and Velocity, Vertical Cavity Surface-Emitting Lasers XX, Edited by K. Choquette, J. Guenter, Proc Of SPIE, 2016, 11 pages, vol. 9766, 07660A.

Non-Final Office Action received for U.S. Appl. No. 15/456,789 dated Sep. 25, 2019, 58 pages.

U.S. Appl. No. 15/456,789, filed Mar. 13, 2017 in the USPTO, 103 pages.

Notice of Allowance received for U.S. Appl. No. 15/456,789 dated Apr. 29, 2020, 45 pages.

International Search Report and Written Opinion received for PCT Application Serial No. PCT/US2017/026109, dated Jun. 19, 2017, 15 pages.

International Search Report and Written Opinion received for PCT Application Serial No. PCT/US2018/021553, dated Jun. 20, 2018, 11 pages.

(56) References Cited

OTHER PUBLICATIONS

U.S. Appl. No. 15/915,840, filed Mar. 8, 2018 in the USPTO, 45 pages.
U.S. Appl. No. 16/028,774, filed Jul. 6, 2018 in the USPTO, 67 pages.
International Preliminary Report on Patentability received for PCT Application Serial No. PCT/US2017/026109, dated Nov. 1, 2018, 13 Pages.
International Search Report and Written Opinion received for PCT Application Serial No. PCT/US2018/041021, dated Nov. 1, 2018, 13 Pages.
International Search Report and Written Opinion received for PCT Application Serial No. PCT/US2019/024343, dated Jul. 12, 2019, 15 Pages.
International Preliminary Report on Patentability received for PCT Application Serial No. PCT/US2018/021553, dated Sep. 26, 2019, 9 pages.
International Search Report and Written Opinion received for PCT Application Serial No. PCT/US2019/043674, dated Nov. 15, 2019, 14 pages.
European Search Report received for European Patent Application No. 17786325.5, dated Nov. 7, 2019, 17 pages.
International Search Report and Written Opinion received for PCT Application Serial No. PCT/US2018/057026, dated Dec. 16, 2019, 09 pages.
International Preliminary Report on Patentability received for PCT Application Serial No. PCT/US18/041021, dated Feb. 6, 2020, 10 pages.
Supplementary European Search Report received for European Patent Application Serial No. EP17786325, dated Mar. 11, 2020, 22 pages.
Decision to Grant for Japanese Patent Application No. 2018-555665, dated Dec. 2, 2020, 05 pages (Including English Translation).
Notification of Reason for Refusal received for JP Patent Application No. 2021-014376, dated Sep. 27, 2021, 16 pages (Including English Translation).
Non-Final Office Action received for U.S. Appl. No. 15/915,840 dated May 7, 2020, 100 pages.
Notice of Allowance received for U.S. Appl. No. 15/915,840 dated Jan. 19, 2021, 40 pages.
Extended European Search Report received for European Patent Application Serial No. 18767885.9, dated Nov. 18, 2020, 10 pages.
Notice of Refusal received for Japanese Patent Application Serial No. 2019-549550, dated Mar. 22, 2021, 6 pages (Including English Translation).
Notice of Preliminary Rejection received for South Korean Patent Application Serial No. 10-2019-7029980, dated Mar. 26, 2021, 7 pages (Including English Translation).
U.S. Appl. No. 17/164,773, filed Feb. 1, 2021, USPTO, 73 pages.
U.S. Appl. No. 17/155,626, filed Jan. 22, 2021, USPTO, 38 pages.
U.S. Appl. No. 17/191,641, filed Mar. 3, 2021, USPTO, 82 pages.
Notice of Grant received for Korean Patent Application Serial No. 10-2019-7029980, dated Aug. 6, 2021, 02 pages (Including English Translation).
Decision of Refusal received for JP Patent Application No. 2019-549550, dated Aug. 27, 2021, 6 pages (Including English Translation).
Notice of Allowance received for U.S. Appl. No. 16/028,774 dated Aug. 21, 2019, 56 pages.
Non-Final Rejection received for U.S. Appl. No. 16/686,163 dated Apr. 16, 2020, 99 pages.
Notice of Allowance received for U.S. Appl. No. 16/686,163 dated Oct. 16, 2020, 30 pages.
Notification of Reason for Refusal received for Korean Patent Application No. 10-2020-7005082, dated May 8, 2020, 19 pages (Including English Translation).
Notice of Reasons For Rejection for Japanese Patent Application No. 2020-504014, dated Sep. 2, 2020, 7 pages (Including English Translation).
Notice of Grant received for Korean Patent Application No. 10-2020-7005082, dated Nov. 24, 2020, 5 pages (Including English Translation).
First Office Action received for Chinese Patent Application No. 201880047615.6, dated Jan. 18, 2021, 14 pages (Including English Translation).
Notice of Allowance for Japanese Patent Application No. 2020-504014, dated Feb. 15, 2021, 5 pages, (Including English Translation).
Extended European Search Report received for European Patent Application No. 18839499.3, dated Mar. 4, 2021, 10 pages.
Notification of Reason for Refusal received for South Korean Patent Application No. 10-2021-7004589, dated Mar. 10, 2021, 9 pages (Including English Translation).
Notice of Reasons For Rejection for Japanese Patent Application No. 2021-056628, dated Jun. 14, 2021, 6 pages (Including English Translation).
Notice of Grant received for Korean Patent Application No. 10-2021-7004589, 2 pages, dated Aug. 6, 2021 (Including English Translation).
Second Office Action received for Chinese Patent Application Serial No. 201880047615.6 dated Aug. 25, 2021, 14 pages (Including English Translation).
Decision to Grant a Patent received for Japanese Patent Application Serial No. 2021-056628 dated Nov. 2, 2021, 5 pages. (Including English Translation).
Non-Final Office Action received for U.S. Appl. No. 16/168,054 dated Jun. 1, 2021, 102 pages.
International Preliminary Report on Patentability received for PCT Application Serial No. PCT/US2018/057026, dated May 28, 2020, 7 pages.
Notification of Reason for Refusal received for Korean Patent Application 10-2020-7016928, dated Jul. 16, 2021, 13 pages (Including English Translation).
International Preliminary Report on Patentability received for PCT Application Serial No. PCT/US2019/024343, dated Oct. 15, 2020, 9 pages.
Notification of Reason for Refusal received for Korean Patent Application No. 10-2020-7029872, dated Jul. 19, 2021, 22 pages (Including English Translation).
Extended European Search Report received for European Patent Application Serial No. 19781037.7 dated Oct. 25, 2021, 9 pages.
Notification of Reason for Refusal received for South Korean Patent Application No. 10-2021-7006391, dated May 14, 2021, 17 pages (Including English Translation).
"Notice of Grant" for Korean Patent Application No. 10-2020-7005082, dated Nov. 24, 2020, 3 pages, The Korean Intellectual Property Office, South Korean (Including English Translation).
Extended European Search Report received for European Patent Application No. 18918938.4, dated Jul. 6, 2021, 9 pages, European Patent Office, Munich, Germany.
Decision to Grant a Patent received for Japanese Patent Application Serial No. 2021-14376 dated Mar. 22, 2022, 05 pages (Including English Translation).
Non-Final Office Action received for U.S. Appl. No. 17/164,773 dated Apr. 21, 2022, 87 pages.
Decision to Grant a Patent received for Chinese Patent Application Serial No. 201880047615.6 dated Mar. 23, 2022, 3 pages (Including English Translation).
Decision to Grant a Patent received for Korean Patent Application Serial No. 10-2018-7030512 dated Mar. 18, 2022, 4 pages (Including English Translation).
Decision to Grant a Patent received for Korean Patent Application Serial No. 10-2021-7036648 dated May 19, 2022, 4 pages (Including English Translation).
"Office Action" for Japanese Patent Application No. 2021-0020502, dated Apr. 13, 2022, 10 pages, Japanese Patent Office, Japan (Including English Translation).
Notice of Allowance received for U.S. Appl. No. 17/227,300 dated Aug. 2, 2022, 39 pages.
International Preliminary Report on Patentability received for PCT Application Serial No. PCT/US2020/043979 dated Feb. 1, 2022, 05 pages.

(56) References Cited

OTHER PUBLICATIONS

Notice of Final Rejection received for Korean Application Serial No. 10-2020-7029872 dated May 24, 2022, 05 pages (Including English Translation).

Decision to Grant a Patent received for Korean Patent Application Serial No. 10-2021-7006391 dated Feb. 9, 2022, 04 pages (Including English Translation).

Restriction Requirement received for U.S. Appl. No. 16/366,729 dated Jun. 3, 2022, 06 pages.

Restriction Requirement received for U.S. Appl. No. 16/523,459, dated Jun. 16, 2022, 05 pages.

Notice of Allowance received for U.S. Appl. No. 16/841,930, dated Jun. 29, 2022, 10 pages.

Non-Final Office Action received for U.S. Appl. No. 16/878,140, dated Jun. 22, 2022, 24 pages.

Non-Final Office Action received for U.S. Appl. No. 16/907,732, dated Jul. 13, 2022, 20 pages.

Non-Final Office Action received for U.S. Appl. No. 16/366,729, dated Aug. 26, 2022, 09 pages.

Notice of Allowance received for U.S. Appl. No. 16/805,733, dated Aug. 22, 2022, 13 pages.

Office Action received for Japanese Patent Application Serial No. 2021-100687, dated Jul. 1, 2022, 09 pages (6 pages of English Translation and 3 pages of Official Copy).

International Preliminary Report on Patentability received for PCT Application Serial No. PCT/US2021/014564, dated Aug. 4, 2022, 06 pages.

Office Action received for Japanese Patent Application Serial No. 2021-168642, dated Aug. 25, 2022, 4 pages (2 pages of English Trasnlation and 2 pages of Official Copy).

Office Action received for Japanese Patent Application Serial No. 2020-526502, dated Aug. 24, 2022, 10 pages (5 pages of English Translation and 5 pages of Official Copy).

EYE-SAFE LONG-RANGE SOLID-STATE LIDAR SYSTEM

CROSS REFERENCE TO RELATED APPLICATION

The present application is a non-provisional application of U.S. Provisional Patent Application No. 62/859,349, filed on Jun. 10, 2019, entitled "Eye-Safe Long-Range Solid-State LIDAR System". The entire contents of U.S. Provisional Patent Application No. 62/859,349 are herein incorporated by reference.

The section headings used herein are for organizational purposes only and should not to be construed as limiting the subject matter described in the present application in any way.

INTRODUCTION

Autonomous, self-driving, and semi-autonomous automobiles use a combination of different sensors and technologies such as radar, image-recognition cameras, and sonar for detection and location of surrounding objects. These sensors enable a host of improvements in driver safety including collision warning, automatic-emergency braking, lane-departure warning, lane-keeping assistance, adaptive cruise control, and piloted driving. Among these sensor technologies, light detection and ranging (LIDAR) systems take a critical role, enabling real-time, high-resolution 3D mapping of the surrounding environment.

The majority of commercially available LIDAR systems used for autonomous vehicles today utilize a small number of lasers, combined with some method of mechanically scanning the environment. It is highly desired that future autonomous automobiles utilize solid-state semiconductor-based LIDAR systems with high reliability and wide environmental operating ranges.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicant's teaching in any way.

DESCRIPTION OF VARIOUS EMBODIMENTS

Figure 1A:
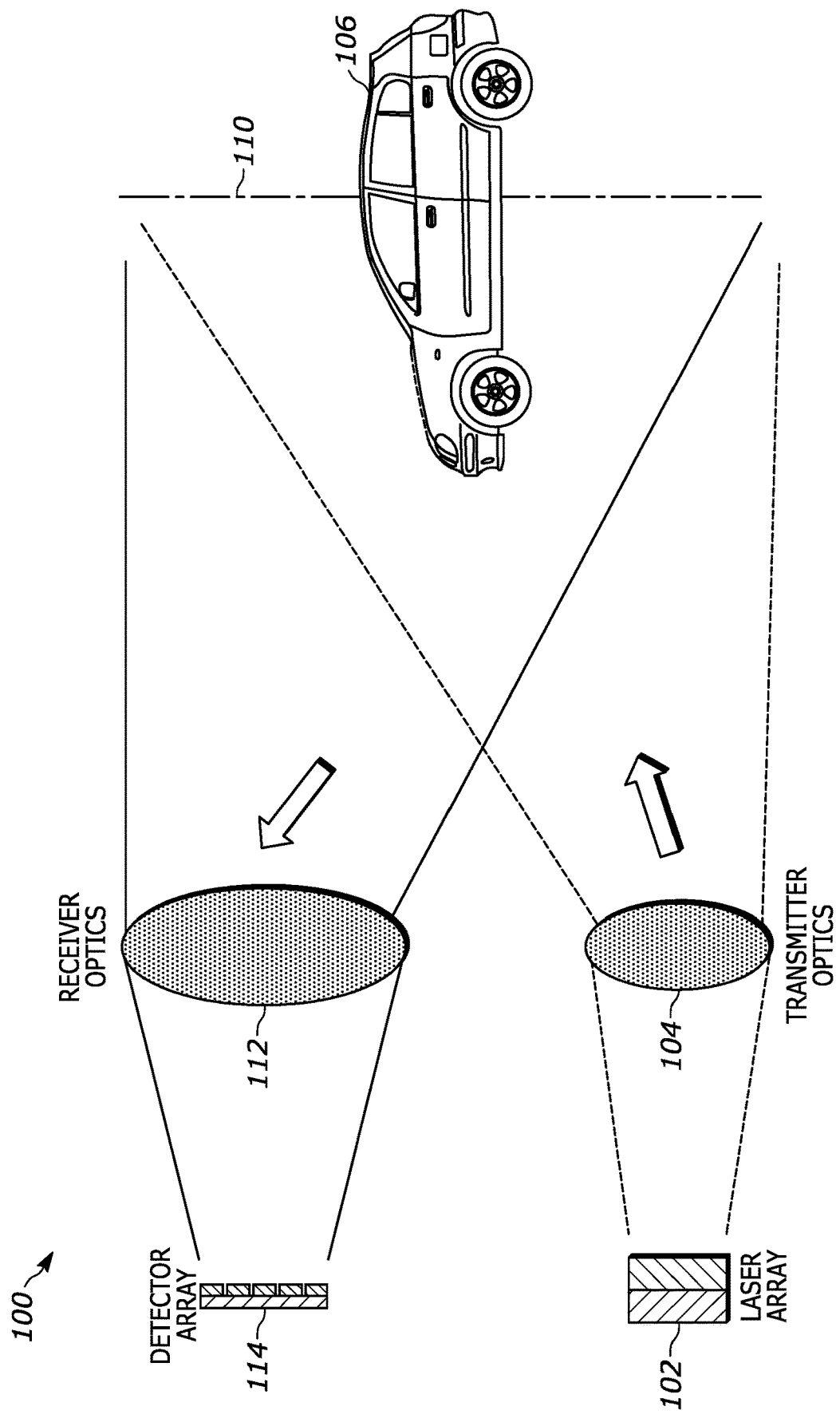
FIG. 1A illustrates a schematic diagram of a known solid-state LIDAR system.

The present teaching will now be described in more detail with reference to exemplary embodiments thereof as shown in the accompanying drawings. While the present teaching is described in conjunction with various embodiments and examples, it is not intended that the present teaching be limited to such embodiments. On the contrary, the present teaching encompasses various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the method of the present teaching can be performed in any order and/or simultaneously as long as the teaching remains operable. Furthermore, it should be understood that the apparatus and method of the present teaching can include any number or all of the described embodiments as long as the teaching remains operable.

The present teaching relates to Light Detection and Ranging (LIDAR), which is a remote sensing method that uses laser light to measure distances (ranges) to objects. Autonomous vehicles make use of LIDAR systems to generate a highly accurate 3D map of the surrounding environment with fine resolution. The systems and methods described herein are directed towards providing a solid-state, pulsed time-of-flight (TOF) LIDAR system with high levels of reliability, while also maintaining long measurement range as well as low cost.

The systems and methods described herein that provide solid-state pulsed TOF LIDAR can also be configured to maintain Class 1 eye safety. A Class 1 eye safety rating means the system is safe under all conditions of normal use. To maintain Class 1 eye safety, the laser optical energy or laser optical power cannot exceed a maximum permissible exposure (MPE) level as defined by U.S. and international safety standards. However, the measurement range of a LIDAR system is strongly dependent on the maximum transmitted optical pulse energy or power level. Therefore, it is desirable for automotive LIDAR systems to intentionally operate as close to the Class 1 MPE limit as feasible.

Given that all LIDAR systems operating at the same wavelength will be subject to the same MPE limits, further improvements in range for one LIDAR system, relative to another LIDAR system operating at power levels near the MPE power limit, must come by innovating aspects of the optical system. One aspect of the present teaching is that a LIDAR system that uses a highly collimated laser beam where all the energy is transmitted into a small FOV can provide a longer measurement range than a system where the same amount of laser light is dispersed over a wider FOV. That is, a highly collimated laser beam, combined with a receiver design that allows measurement over a similarly small field-of-view (FOV), will result in a desirable ratio of reflected signal power to background light level, which improves range capability.

One type of known solid-state LIDAR system is a so-called Flash LIDAR system, which employs an emission source that emits laser light over a wide FOV. Some Flash LIDAR systems are solid-state. Flash LIDAR systems can illuminate the entire scene with a single illumination event. But, for LIDAR systems operating at the Class 1 eye safety MPE limit, the wide FOV illuminated by Flash LIDAR significantly limits measurement range compared to a system where the light from the emission source is highly collimated.

The pulsed TOF LIDAR system of the present teaching uses collimated transmitter laser beams with optical power/energy at, or slightly below, the MPE limit for Classl eye safety to provide a significant range increase compared to a conventional Flash LIDAR system. In addition, the pulsed TOF LIDAR systems of the present teaching use pulse averaging and/or pulse histogramming of multiple laser pulses to improve Signal-to-Noise Ratio (SNR), which further improves range. These LIDAR systems employ a very high single pulse frame rate, well above 100 Hz.

FIG. 1A illustrates a schematic diagram of a known solid-state LIDAR system 100. The system illustrated in FIG. 1A does not employ a flash transmitter that illuminates the full system field-of-view all at once. A laser array 102 generates various patterns of optical beams. An optical beam is emitted from an emitter in the array 102 when that emitter is activated by a control pulse. One or more emitters are activated sometimes according to a particular sequence. The optical beams from the lasers in the laser array 102 propagate though common transmitter optics 104 that project the optical beams to the target 106 at a target plane 110. The target 106 in this particular example is an automobile 106, but it is understood that the target can be any object.

Portions of the light from the incident optical beams are reflected by the target 106. These portions of reflected optical beams share the receiver optics 112. A detector array 114 receives the reflected light that is projected by the receiver optics 112. In various embodiments, the detector array 114 is solid-state with no moving parts. The detector array 114 typically has a fewer number of individual detector elements than the transmitter array 102 has individual lasers.

The measurement resolution of the LIDAR system 100 is not determined by the size of the detector elements in the detector array 114, but instead is determined by the number of lasers in the transmitter array 102 and the collimation of the individual optical beams. In other words, the resolution is limited by a field-of-view of each optical beam. A processor (not shown) in the LIDAR system 100 performs a time-of-flight (TOF) measurement that determines a distance to the target 106 from optical beams transmitted by the laser array 102 that are detected at the detector array 114.

One feature of LIDAR systems according to the present teaching is that individual lasers and/or groups of lasers in the transmitter array 102 can be individually controlled. Each individual emitter in the transmitter array can be fired independently, with the optical beam emitted by each laser emitter corresponding to a 3D projection angle subtending only a portion of the total system field-of-view. One example of such a LIDAR system is described in U.S. Patent Publication No. 2017/0307736 A1, which is assigned to the present assignee. The entire contents of U.S. Patent Publication No. 2017/0307736 A1 are incorporated herein by reference.

Another feature of LIDAR systems according to the present teaching is that detectors and/or groups of detectors in the detector array 114 can also be individually controlled. This independent control over the individual lasers and/or groups of lasers in the transmitter array 102 and over the detectors and/or groups of detectors in the detector array 114 provide for various desirable operating features including control of the system field-of-view, optical power levels, and scanning pattern.

Figure 1B:
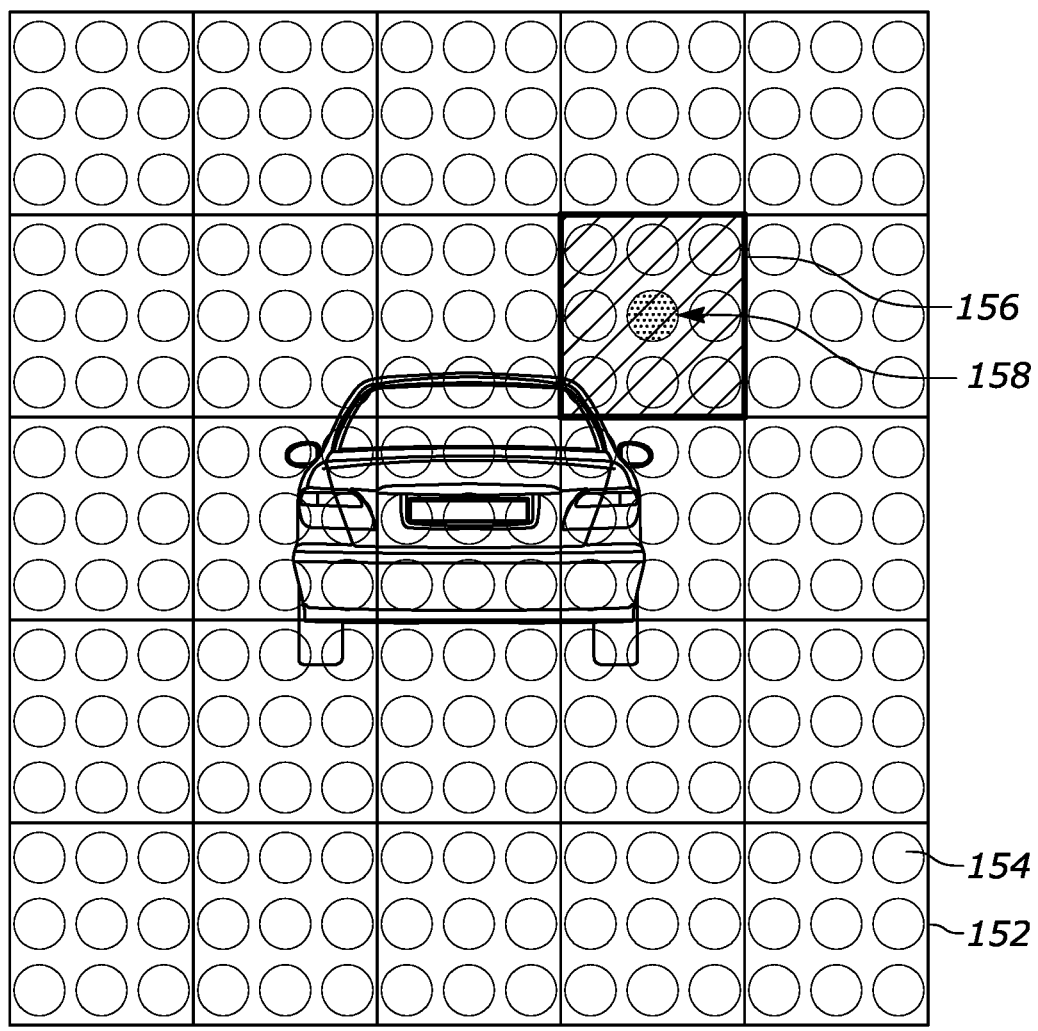
FIG. 1B illustrates a two-dimensional projection of the system Field-of-View (FOV) of the LIDAR system of FIG. 1A.

FIG. 1B illustrates a two-dimensional projection of the system field-of-view 150 of the LIDAR system of FIG. 1A. Referring to both FIGS. 1A and 1B, a field-of-view of an individual detector in the detector array is represented by a small square 152. An illuminated measurement point associated with an individual emitter in the transmitter laser array 102 is illustrated by a circle 154. A single 3D measurement point in the overall field-of-view of the LIDAR system of FIG. 1A is shown as particular dark circle 158, which corresponds to a specific individual laser in the laser array. It can be further seen in FIG. 1B that this measurement point falls within an individual detector where the field-of-view of that individual detector in the detector array 114 has been shown in the square 156 with a cross-hatch pattern for identification. This figure illustrates that the 3D resolution of some embodiments of the LIDAR system are determined by the number of lasers, as each laser corresponds to a specific angular projection angle that gives rise to the size of the circles 154 at the target range, and the relative size of the circles 154 and the squares 152 that represent the field-of-view of an individual detector element.

Thus, desired fields-of-views can be established by controlling particular individual or groups of lasers in a transmitter array and/or controlling individual or groups of detectors in a receive array. Various system fields-of-view can be established using different relative fields-of-view for individual or groups of emitters and/or individual or groups of detectors. The fields-of-view can be established so as to produce particular and/or combinations of performance metrics. These performance metrics include, for example, improved signal-to-noise ratio, longer range or controlled range, eye safe operation power levels, and lesser or greater controllable resolutions. Importantly, these performance metrics can be modified during operation to optimize the LIDAR system performance.

LIDAR systems according to the present teaching use an array drive control system that is able to provide selective control of particular laser devices in an array of laser devices in order to illuminate a target according to a desired pattern. Also, LIDAR systems according to the present teaching can use an array of detectors that generate detector signals that can be independently processed. Consequently, a feature of the LIDAR systems of present teaching is the ability to provide a variety of operating capabilities from a LIDAR system exclusively with electronic, non-mechanical or non-moving parts that include a fixed array of emitters and a fixed array of detectors with both the transmit and receive optical beams projected using shared transmit and receive optics. Such a LIDAR system configuration can result in a flexible system that is also compact, reliable, and relatively low cost.

Figure 2A:
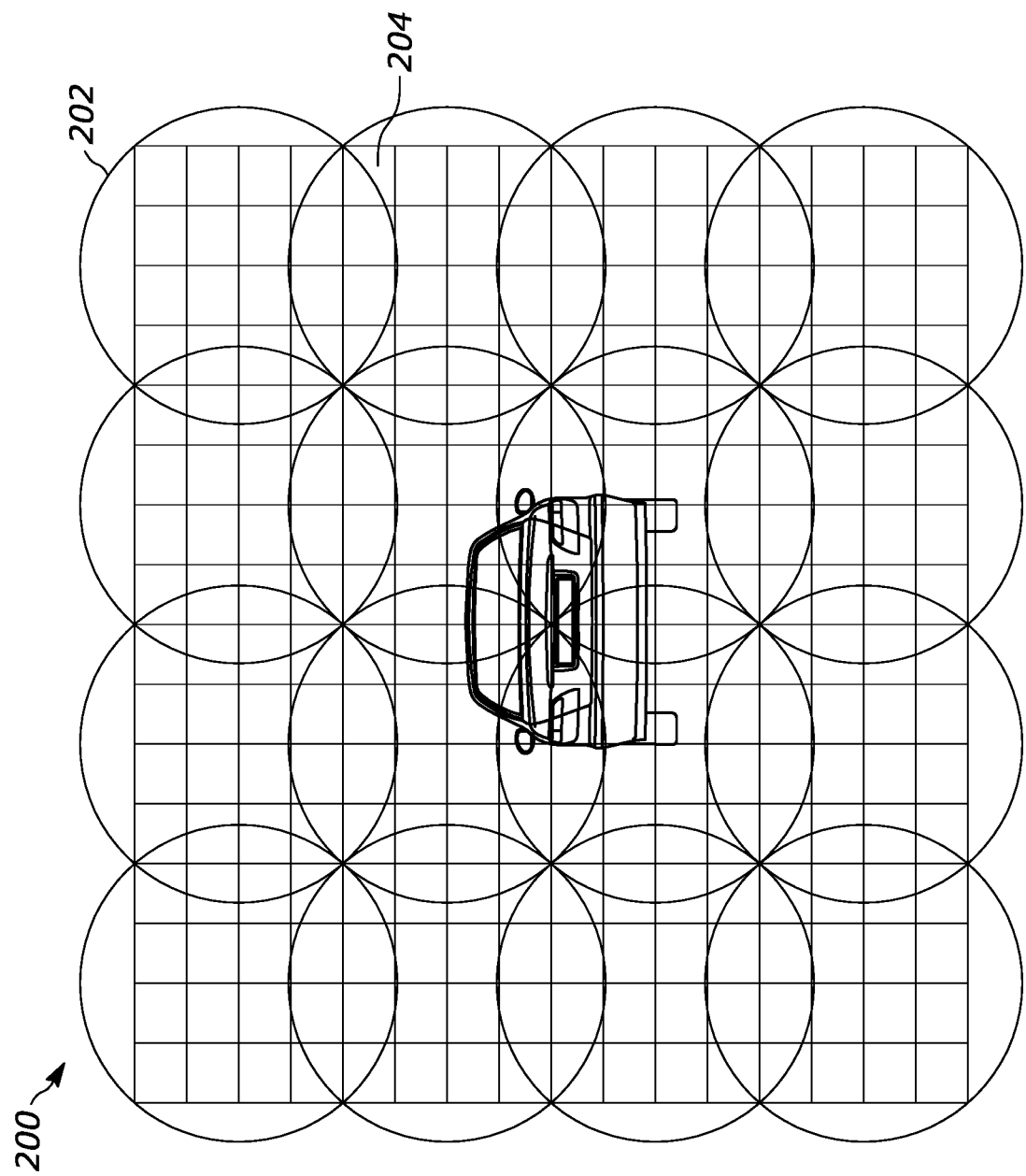
FIG. 2A illustrates a two-dimensional projection of a LIDAR system FOV of an embodiment of a LIDAR system according to the present teaching.

LIDAR systems of the present teaching also utilize a laser array, transmitter optics, receiver optics and detector array as described in connection with the known system shown in FIG. 1A. However, these elements in the present teaching are chosen and configured such that the two-dimensional projection of the system field-of-view is different. One feature of the present teaching is that the elements are configured such that the field-of-view of a single emitter is larger than a field-of-view of a single detector. FIG. 2A illustrates an embodiment of a two-dimensional projection of a LIDAR system field-of-view 200 of an embodiment of a LIDAR system of the present teaching. The system that produces the two-dimensional projection of the LIDAR system field-of-view 200 shown in FIG. 2A is a projection LIDAR system with a laser array and transmit optics configured such as described in connection with LIDAR systems of FIGS. 1A and 1B. However, the elements are spaced and arranged to produce the LIDAR system FOV 200 as shown. Specifically, an array of lasers and associated transmit optics is configured to produce an array of beams with circular FOV's with a particular size, represented by the sixteen circles 202 as shown. Various embodiments generate various shapes of laser beam FOV depending on the emitter and projection optics.

The LIDAR system FOV 200 shown in FIG. 2A is generated by a 4×4 (16) laser array. The divergence/collimation of the laser has been chosen so that there is only enough overlap of each of the optical beams such that there are no "gaps" in the field-of-view. That is, the circles 202 overlap and form a 4×4 array. An array of detectors provides an array of square FOV's with a particular size, represented by 256 squares 204. The individual detector region represented by square 204 is sometimes referred to as a pixel. It can be seen that there are 16×16 (256) detectors with practically continuous coverage across the array. It should be understood that the number of lasers and detectors, and the particular size and shape of the FOV of the emitter and detector elements, has been chosen to illustrate features of the present teaching, and are not necessarily representative of an actual system.

In the embodiment of the LIDAR system of FIG. 2A, the number of detectors (256) exceeds the number of lasers (16). This embodiment represents an important use case for LIDAR systems according to the present teaching in which the FOV of a laser emitter, represented by a circle 202, covers the FOV of a number of detectors, represented by squares 204.

Various detector technologies are used to construct the detector array for the LIDAR systems according to the present teaching. For example, Single Photon Avalanche Diode Detector (SPAD) arrays, Avalanche Photodetector (APD) arrays, and Silicon Photomultiplier Arrays (SPAs) can be used. The detector size not only sets the resolution by setting the FOV of a single detector, but also relates to the speed and detection sensitivity of each device. State-of-the-art two-dimensional arrays of detectors for LIDAR are already approaching the resolution of VGA cameras, and are expected to follow a trend of increasing pixel density similar to that seen with CMOS camera technology. Thus, smaller and smaller sizes of the detector FOV represented by square 204 are expected to be realized over time. For example, an APD array with 264,000 pixels (688(H)×384(V)) was recently reported in "A 250 m Direct Time-of-Flight Ranging System Based on a Synthesis of Sub-Ranging Images and a Vertical Avalanche Photo-Diodes (VAPD) CMOS Image Sensor", Sensors 2018, 18, 3642.

Figure 2B:
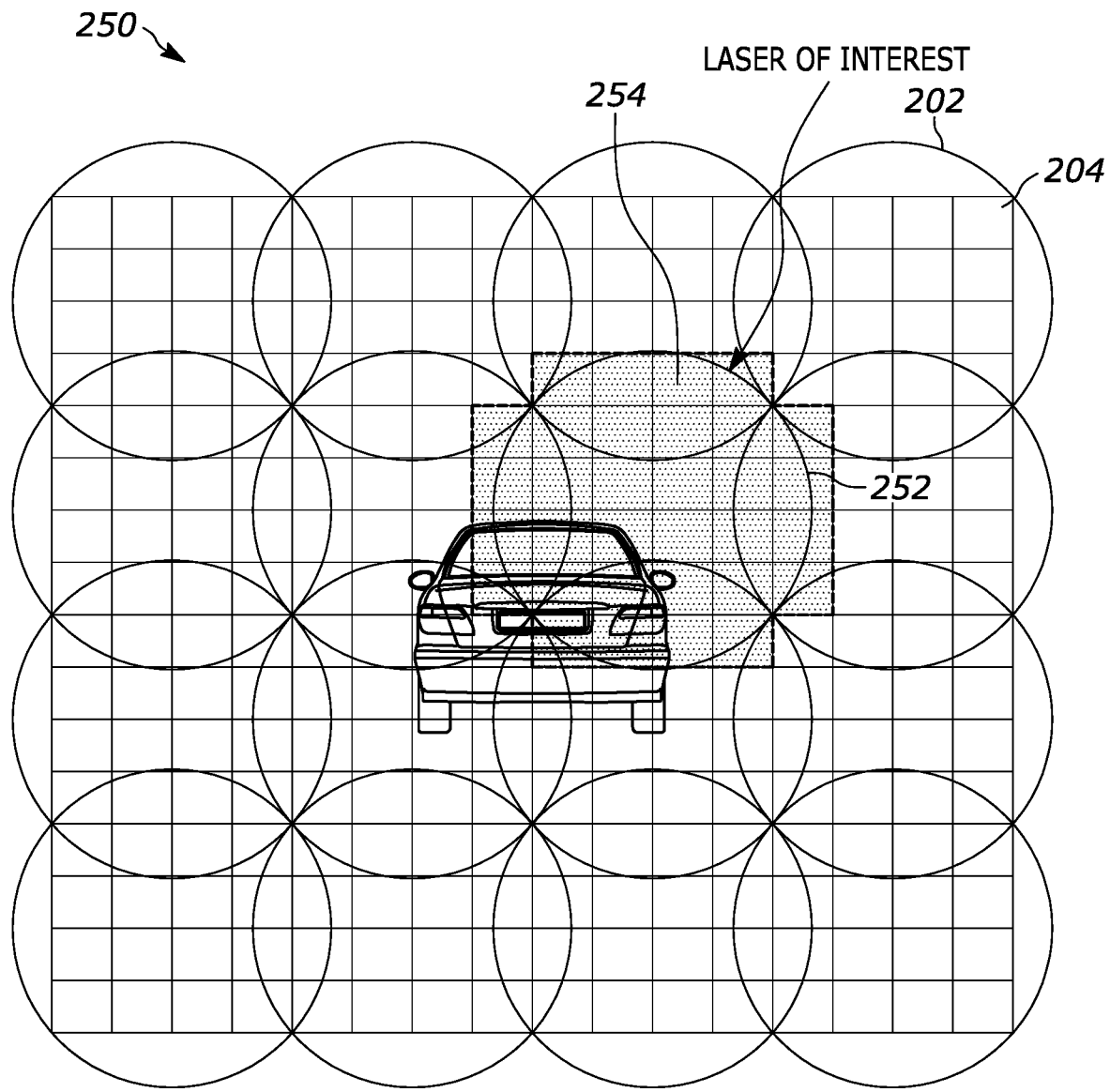
FIG. 2B indicates the detectors corresponding to a single laser in a two-dimensional projection of the LIDAR system FOV of an embodiment of a LIDAR system according to the present teaching.

FIG. 2B indicates the detectors corresponding to a single laser in a two-dimensional projection of the system FOV of an embodiment of a LIDAR system 250 according to the present teaching. Similar to the LIDAR system FOV 200 shown in FIG. 2A, a single laser FOV is represented by a circle 202, and a single detector is represented by a square 204. A laser of interest is energized by a controller to illuminate a FOV represented by a particular circle 252. The controller generates a bias signal that energizes the desired laser or lasers at the desired time. The detector FOVs that overlap with at least some portion of the laser beam FOV represented by the circle 252 are within the shaded region 254 in the system FOV. In this particular configuration, a detector region 254 that includes thirty-two individual detector FOVs is realized for a single laser beam FOV 252. Each detector FOV in the detector region 254 has a FOV associated with a small square 204. Note that in various embodiments, the detector region 254 is not necessarily square or rectangular. The shape of the region 254 depends on detector shape and the laser beam profile, either of which can be any shape (circular, square, or other).

A controller selects a set of one or more detectors in region 254 that fall within the laser beam FOV 252 of the selected laser. Signals from the selected set of detectors are detected simultaneously and the detected signal provided to the controller and then processed to generate a single measurement pulse. For long-range operation, including operation at the longest specified range of the LIDAR system, the number of pixels (i.e. individual detectors) used to generate the measurement pulse might be chosen to maximize the SNR at the expense of resolution. For example, the best SNR might correspond to a measurement made by summing or combining in some fashion the received signal from all the detectors in region 254 shown highlighted in FIG. 2B. That is, multiple contiguous detectors that fall within the FOV 252 of the selected laser might be chosen. In some embodiments, only those detectors that are fully illuminated by the light in the FOV 252 of the laser are chosen. That way, noise from detectors that are not fully illuminated is not accumulated. Alternatively, a smaller subset of detectors might be chosen. For instance, in some configurations according to the present teaching, the power from the laser is not distributed uniformly across the beam profile. In these configurations, a subset of detectors that matches the profile of the beam can be used so the detectors that receive a higher intensity of the incident light are selected.

At some ranges, instead of combining the pixel signals to maximize the SNR for longest measurement range, it can be desirable to produce a higher resolution image. For example, at close range, each pixel or a smaller set of pixels can be measured individually to provide a higher resolution image of the scene. In these embodiments, a number of detectors are chosen that provide a particular size or shape of a detector FOV to contribute to a particular measurement pulse provide a particular resolution at a target range.

Figure 2C:
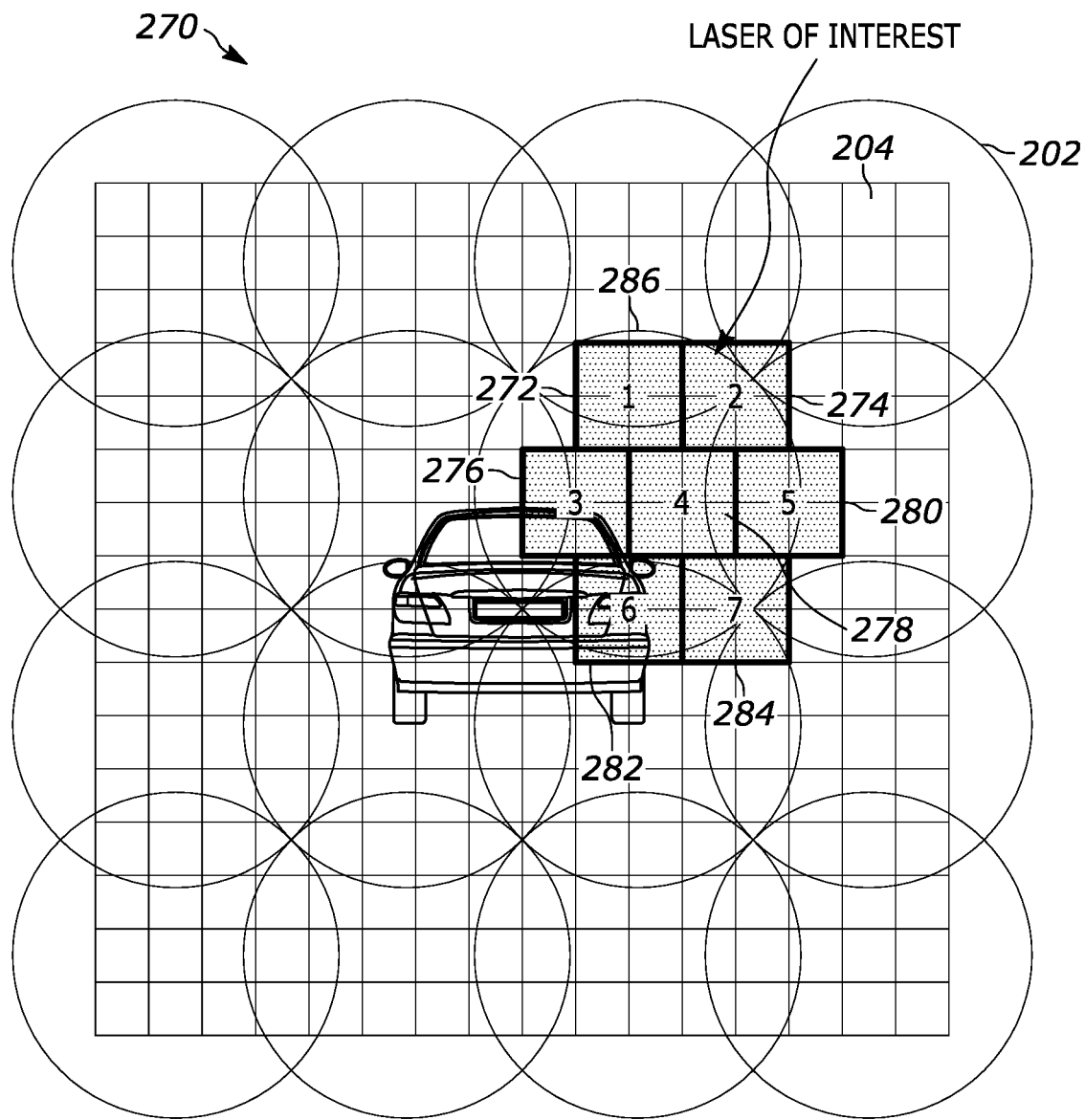
FIG. 2C illustrates a two-dimensional projection of the LIDAR system FOV of an embodiment of a LIDAR system with a detector grouping corresponding to a single laser FOV that provides a particular resolution according to the present teaching.

FIG. 2C illustrates a two-dimensional projection of the LIDAR system FOV 270 of an embodiment of a LIDAR system with a detector grouping for a single laser FOV 286 that provides a particular resolution according to the present teaching. Like FIG. 2A, a single laser FOV is represented by a circle 202, and a single detector, which in this configuration represents a single pixel, by a square 204. In this embodiment, seven groups 272, 274, 276, 278, 280, 282, 284 of four pixels each are used with a single laser beam FOV represented by circle 286. The seven groups 272, 274, 276, 278, 280, 282, 284 of four pixels can each be individually selected to contribute to a particular measurement pulse. Each measurement pulse will produce a resolution that is based on the size of the particular group 272, 274, 276, 278, 280, 282, 284. Thus, in this case, seven measurements, each with a resolution of less than the resolution of the illuminating laser spot FOV, circle 286, are available within the illuminating FOV, circle 286. Thus, by choosing a particular number and shape of detectors, a variety of resolutions can be provided. For example, using only two pixels vertically arranged, rather than four pixels as shown in the groups 272, 274, 276, 278, 280, 282, 284 of FIG. 2C, would produce the same resolution in the vertical dimension, and half the resolution in the horizontal dimension. Similarly, using only two pixels horizontally arranged, rather than the four pixels, would produce the same resolution as the groups 272, 274, 276, 278, 280, 282, 284 in the horizontal dimension, and half the resolution in the vertical dimension. The various groupings described are just examples. Detectors are chosen to provide a group size and shapes to provide a desired resolution for a particular measurement.

Figure 3:
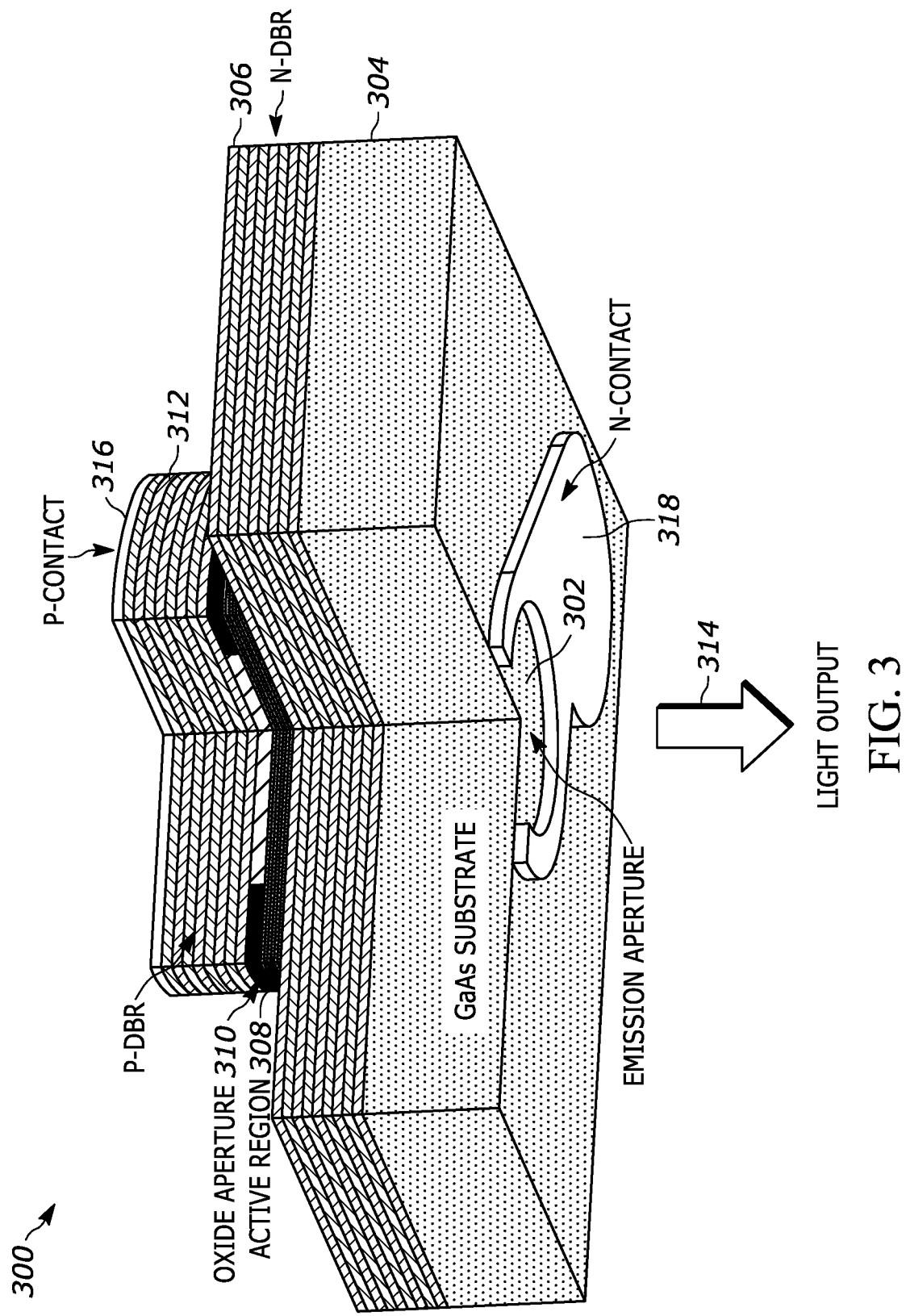
FIG. 3 illustrates a perspective view of a schematic diagram of the structure of a known bottom-emitting Vertical Cavity Surface Emitting Laser (VCSEL) used in some embodiments of the LIDAR transmitter of the present teaching.

FIG. 3 illustrates a perspective view of a schematic diagram of the structure of a known bottom-emitting Vertical Cavity Surface Emitting Laser (VCSEL) 300 used in some embodiments of the LIDAR transmitter of the present teaching. The area of the emission aperture 302 of the VCSEL 300 typically ranges from a few microns in diameter for mW power operation, up to a 100 micron diameter or more for 100 mW and greater CW power operation. The VCSEL 300 is fabricated on a substrate 304 that can be, for example, GaAs, or numerous other semiconductor materials.

An n-type distributed Bragg reflector (DBR) layer 306 is positioned on the substrate. An active region 308 is constructed on the n-type DBR layer 306, followed by an aperture 310 that can be made formed in an oxide material. A p-type DBR layer 312 is then grown on the active region. Typically, the p-type DBR layer 312 is highly reflecting, and the n-type DBR layer 306 is partially reflecting, resulting in light output 314 from the bottom, substrate-side of the layer structure. The active region 308, oxide aperture 310, and p-type DBR layer 312 are formed in a mesa structure in the device shown. A top contact 316 and a bottom contact 318 are used to provide an electrical current to the active region to generate the output light. An oxide aperture 310 provides current confinement to the active region 308. The top contact 316 is p-type, and the bottom contact 318 is n-type.

Emission apertures 302 are formed in the bottom contact 318 to allow the output light 314 to emerge from the bottom, substrate side of the bottom-emitting VCSEL 300. Note that only one emission aperture 302 is shown in FIG. 3 because FIG. 3 illustrates only one emitter of a multi-emitter VCSEL array. This type of VCSEL can be a stand-alone single emitter, or can be part of a multiple emitter VCSEL that can be fabricated as one- or two-dimensional arrays on the substrate 304. The VCSEL contacts 316, 318 can be addressed individually and/or can be electrically connected together in various configurations to address groups of VCSELS with a common electrical input signal. One feature of the present teaching is a system and method for controlling the energizing of the one or more VCSEL 300 devices in an array with an appropriate drive signal for a particular LIDAR system application.

Various embodiments of the present teaching use a variety of known VCSEL laser devices, including top-emitting VCSELs, bottom-emitting VCSELs, and various types of high-power VCSELs.

In some embodiments, the VCSEL array is monolithic and the lasers all share a common substrate. A variety of common substrate types can be used. For example, the common substrate can be a semiconductor material. The common substrate can also include a ceramic material. In some embodiments, the VCSEL array is a 2D VCSEL array and the 2D VCSEL array is assembled from a group of 1D bars or even from numerous individual die.

One feature of the LIDAR systems according to the present teaching is that they can provide controllable fields-of-view for a variety of laser arrays. Some embodiments use VCSEL arrays. In some embodiments, the VCSELs are top-emitting VCSELs. In other embodiments, the VCSELs are bottom-emitting VCSELs. The individual VCSELs can have either a single large emission aperture, or the individual VCSELs can be formed from two or more sub-apertures within a larger effective emission diameter. A group of sub-apertures forming a larger effective emission region is sometimes referred to as a cluster. The sub-apertures in a cluster can be electrically connected in parallel so that they are electronically activated by a single control signal.

Figure 4A:
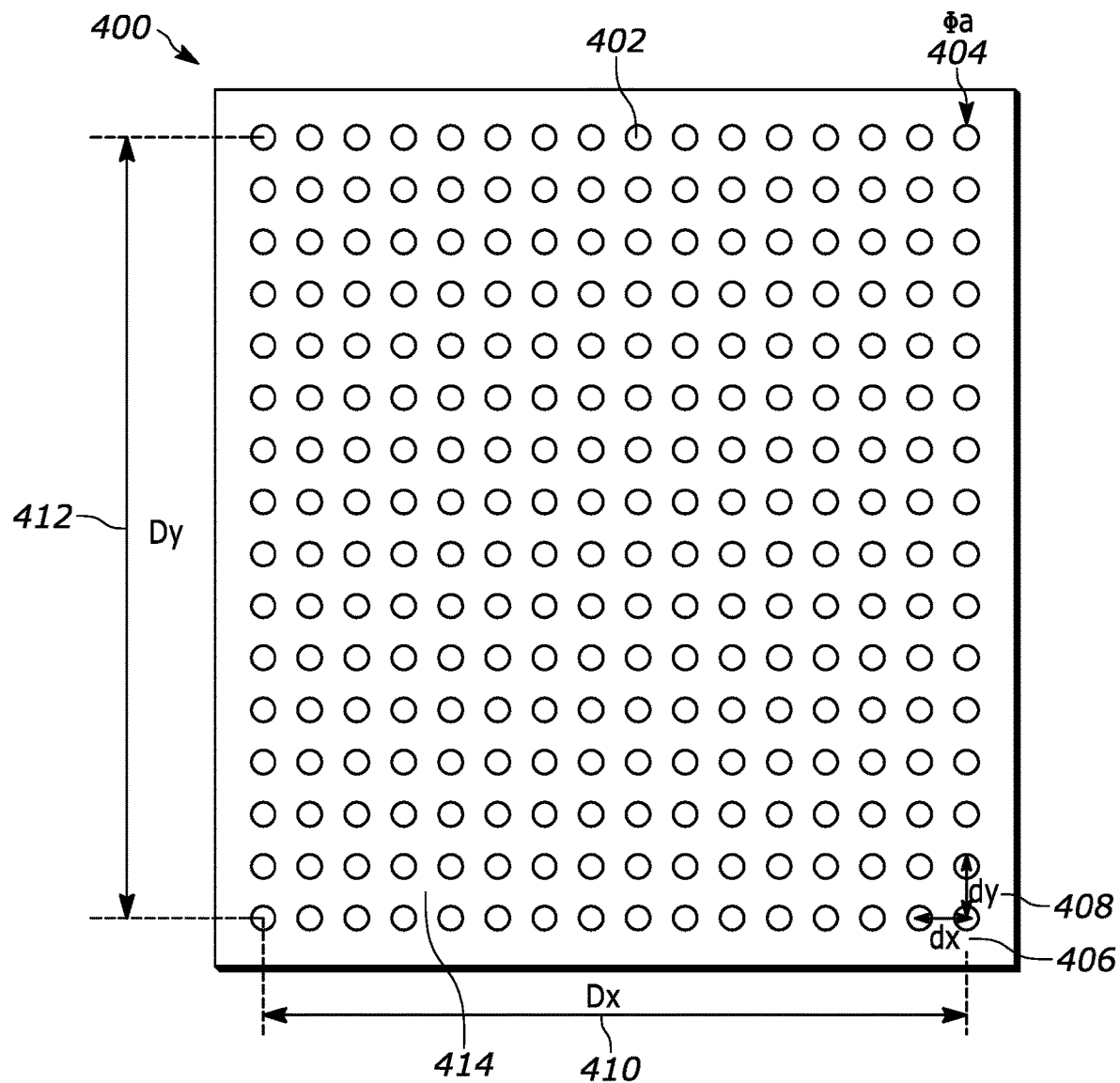
FIG. 4A illustrates a schematic diagram of a 2D monolithic VCSEL array with 256 separate laser emitters, where each emitter corresponds to a single large aperture that can be used in some embodiments of the LIDAR transmitter of the present teaching.

FIG. 4A illustrates a schematic diagram of a 2D monolithic VCSEL array 400 with 256 separate laser emitters 402, where each emitter 402 corresponds to a single large aperture, that is used in some embodiments of the LIDAR transmitter of the present teaching. Each laser emitter has an emission aperture of diameter, a 404. Emission from each single laser emitter 402 substantially fills the full emission aperture diameter, a 404. Each laser emitter, therefore, generates a laser beam with initial diameter, "a" 404, that is equal to the diameter of the emission aperture. The laser emitters are spaced uniformly in the horizontal direction with a spacing dx 406 and are spaced uniformly in the vertical direction with a spacing dy 408. The overall size of the array, as measured from the centers of the outermost lasers, is distance Dx 410 in the horizontal direction and distance Dy 412 in the vertical direction. The actual chip size will be slightly larger than the dimensions Dx 410 and Dy 412. In various embodiments, the emitters may produce optical beams with various shapes. For example, oval, square, rectangular and various odd shapes can be realized.

Figure 4B:
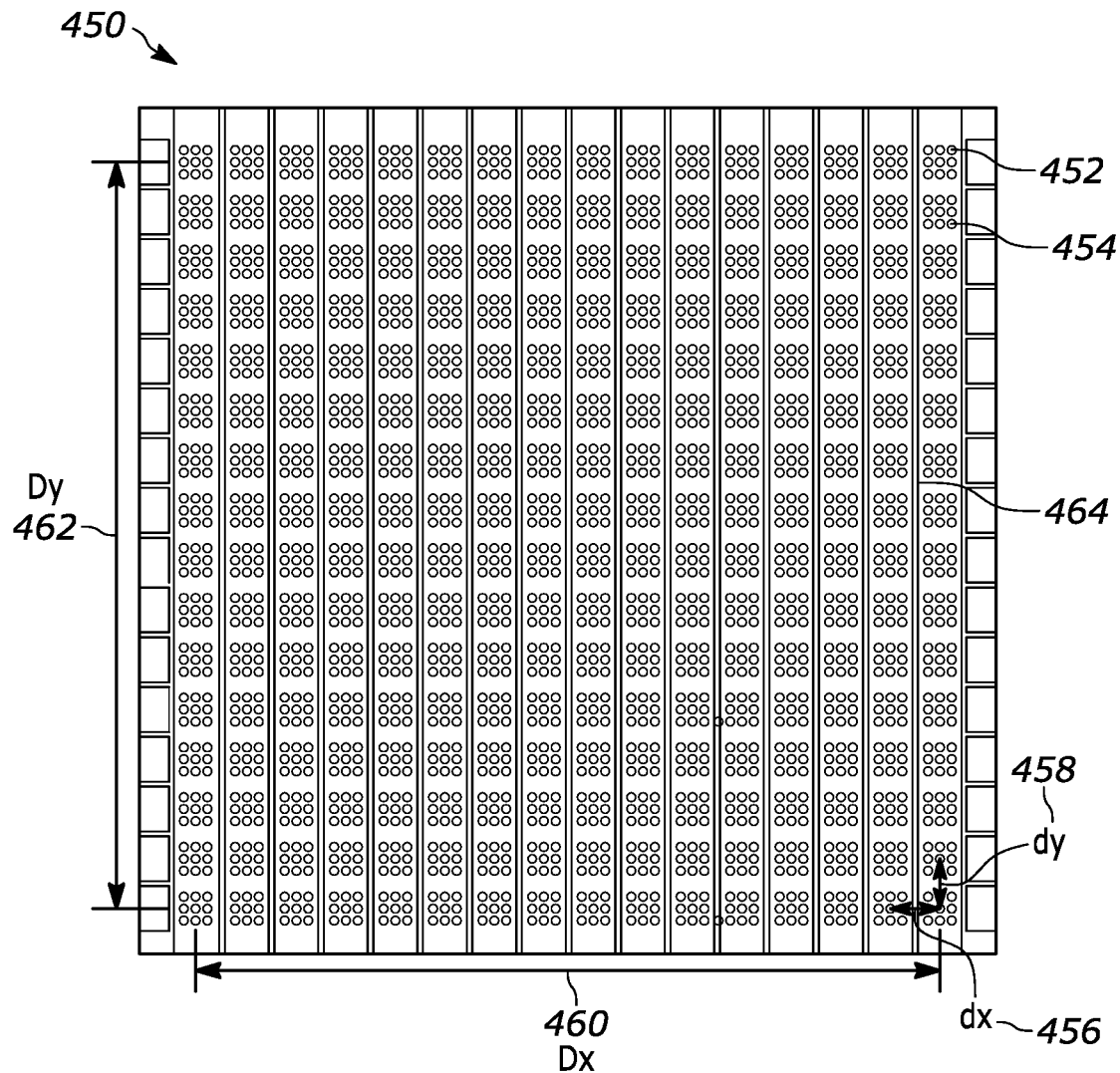
FIG. 4B illustrates a schematic diagram of a 2D monolithic VCSEL array with 256 separate laser emitters, where each emitter has nine sub-apertures that can be used in some embodiments of the LIDAR transmitter of the present teaching.

FIG. 4B illustrates a schematic diagram of a 2D monolithic VCSEL array 450 with 256 separate laser emitters 452, where each laser emitter 452 has nine sub-apertures 454, that can be used in some embodiments of the LIDAR transmitter of the present teaching. Emission from each single laser emitter 452 results in emission from all nine sub-apertures 454. In the case where one or more of the nine sub-apertures 454 fails to emit light due to fabrication anomalies or device failures, the emitter 452 still functions and generates an optical beam albeit at a lower output power. The output optical beam will correspond to the pattern of the sub-apertures 454, and the sub-apertures 454 can be arranged in a variety of shapes. In the configuration shown, the output beam is nominally square in shape, corresponding to the emitter 452 shape of a 3×3 square array of the nine sub apertures 454. The laser emitters 452 are spaced uniformly in the horizontal direction with a spacing dx 456 and spaced uniformly in the vertical direction with a spacing dy 458. The overall size of the array measured from the centers of the outermost lasers is distance Dx 560 in the horizontal direction and distance Dy 462 in the vertical direction. The actual chip size will be slightly larger than the distance Dx 460 and distance Dy 462. A variety of array patterns, including regular and irregular arrays, is possible. The VCSELs of FIGS. 4A-B include areas of the VCSEL die where no light emits, e.g. regions 414, 464.

Some embodiments of the present teaching utilize bottom-emitting high-power arrays of VCSELs with a single large aperture per laser, and configured in a regularly spaced rectangular array, such as in the configuration shown in FIG. 4A. Other embodiments of the present teaching utilize top-emitting or bottom-emitting high-power arrays of VCSELs with an overall emission area comprising sub-apertures. However, one skilled in the art will appreciate that the present teaching is not limited to any single configurations of top- and bottom-emitting VCSELs, associated emission apertures, or array spacings or shapes.

One feature of the LIDAR systems of present teaching is that the emitters may not all emit light at the same wavelength. The wafer production process used to produce VCSEL typically results in each wafer having one center wavelength, with the distribution of wavelengths across the wafer within a few nanometers around the center value. So, LIDAR systems that use multiple wavelengths would typically use multiple individual die, each die of one particular wavelength, and then arrange these die together with an optic system to produce a desired far-field projection pattern. Two common types of far-field projection patterns are side-by-side and interleaved. In side-by-side far-field projection patterns, the FOV is split into regions of different wavelength that are adjacent to each other, with only the edges overlapping, whereas in an interleaved pattern, the majority of the FOV contains two more wavelengths.

The use of 2D VCSEL arrays as a building block of the LIDAR systems of the present teaching establishes a transmitter platform that allows a small physical size for the transmitter. For example, it is possible to fabricate a typical 2D array with 256 high-power individual laser emitters on a monolithic chip having dimensions that are approximately 4 mm×4 mm. The monolithic 2D laser array is then used together with transmit optics that are chosen to keep the physical dimension as small as possible. For example, some embodiments use micro-lens arrays with sizes similar to the monolithic chip. Other embodiments use shared lenses having a diameter, for example, less than 20 mm. Yet other embodiments use diffractive optics with, for example, maximum dimensions of 20 mm diameter.

One feature of the LIDAR systems of the present teaching is that the spacing and/or the divergence of the optical beams produced by the emitters can be configured to generate emitter FOVs that have a desired pattern, shape or other specified characteristic. For example, the optical beams can be made to overlap or to not overlap. The choice of the FOV pattern provides control over, for example, range, eye safety power level, signal-to-noise ratio and/or resolution, depending on the particular pattern.

Figure 5:
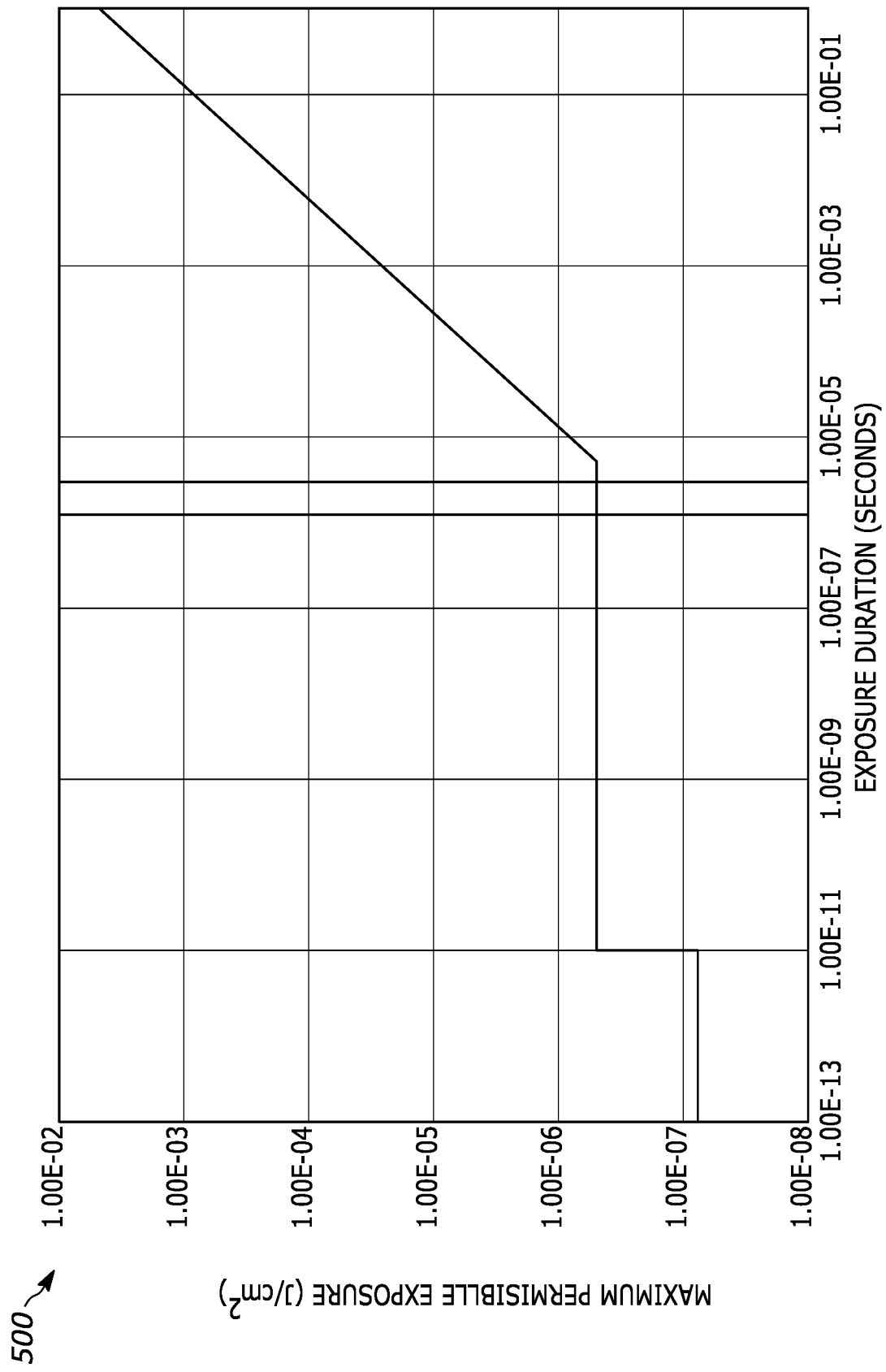
FIG. 5 shows a graph of one example of the Maximum Permissible Exposure (MPE) in $J/cm^2$ allowed for Class 1 calculated based on the IEC-60825 standard at a wavelength of 905 nm.

A solid-state LIDAR system of the present teaching adheres to the Class1 eye safety limits. FIG. 5 shows a graph 500 of one example of the MPE in $J/cm^2$ allowed for Class 1 calculated based on the IEC-60825 standard at a wavelength of 905 nm. It should be understood that this is a representative calculation only. MPE is based on a number of considerations and this example is used for illustration purposes. The values shown in FIG. 5 will change based on specific details of the exact laser and optics used. It can be seen from FIG. 5, however, that the MPE limit changes with exposure duration. As a result, the length of time lasers are energized will affect how much peak power can be used. A key period of time corresponding to a TOF system is shown as a highlighted area in the graph from 1 μsec to 3 μsec. This corresponds to the time it would take a laser pulse to travel out and back to a target at 150 m and 450 m, respectively. It is clear that a single laser pulse with optical power at the MPE limit is thus constrained by the eye safety exposure duration. A single pulse that is at the MPE limit can only be fired once every 5 μsec, as almost no relative motion can occur in such a short time to change the relationship between the laser and the measurement aperture located at a distance of 100 mm as defined by the eye safety standard. In the case of a LIDAR system, where pulse averaging is desired, this limits the firing rate of an individual laser to >5 μsec, when the individual laser operates at the MPE limit of Class 1.

One feature of the present teaching is that the positioning of the one or more transmitter arrays, transmit optics, receive optics and detector array relative to each other is such that it is possible to control the pattern of firing of lasers to support multiple-pulse averaging and/or provide a histogram of measurement pulses. In some embodiments a group of lasers is selected and this group of lasers is energized in a sequence. The sequence is then repeated a number of times, such that measurement pulses derived from each laser can be averaged over that number of repeats. For example, a sequence such as A-B-C-D-A-B-C-D, where each letter is a particular emitter in a group of four emitters, may be repeated up to N times.

In some embodiments, the sequence is chosen such that the optical power from the LIDAR system does not exceed an eye safety limit. In some embodiments, for example, each emitter is energized to produce an optical power that is at or close to the MPE. Thus, if two or more laser emitter's optical beams overlap, the MPE can be exceeded. In this case, the firing sequence for the laser pattern is such that no two lasers with overlapping FOVs such that the MPE is exceeded would be fired at the same time. For example, this may mean that two lasers with overlapping FOVs are fired at different points in the sequence. However, lasers with non-overlapping FOVs may be fired simultaneously.

The physical architecture that is the particular positions of the laser arrays, transmit optics, receive optics and detector arrays, is configured to support particular performance goals. For example, in some embodiments, individual lasers in a sequence are physically located in separate arrays. For example, lasers designated A and C, in the example above, are in one array, and lasers designated B and D are in a different array. In some embodiments the detector array shape and configuration puts a constraint of the sequence and/or the repeat value. For example, some detector arrays operate best if sequential measurements are constrained to a particular row or column in a set of measurement data. This is because detector arrays may not be able to switch or reconfigure detection events fast enough to support an arbitrary geometry.

Figure 6:
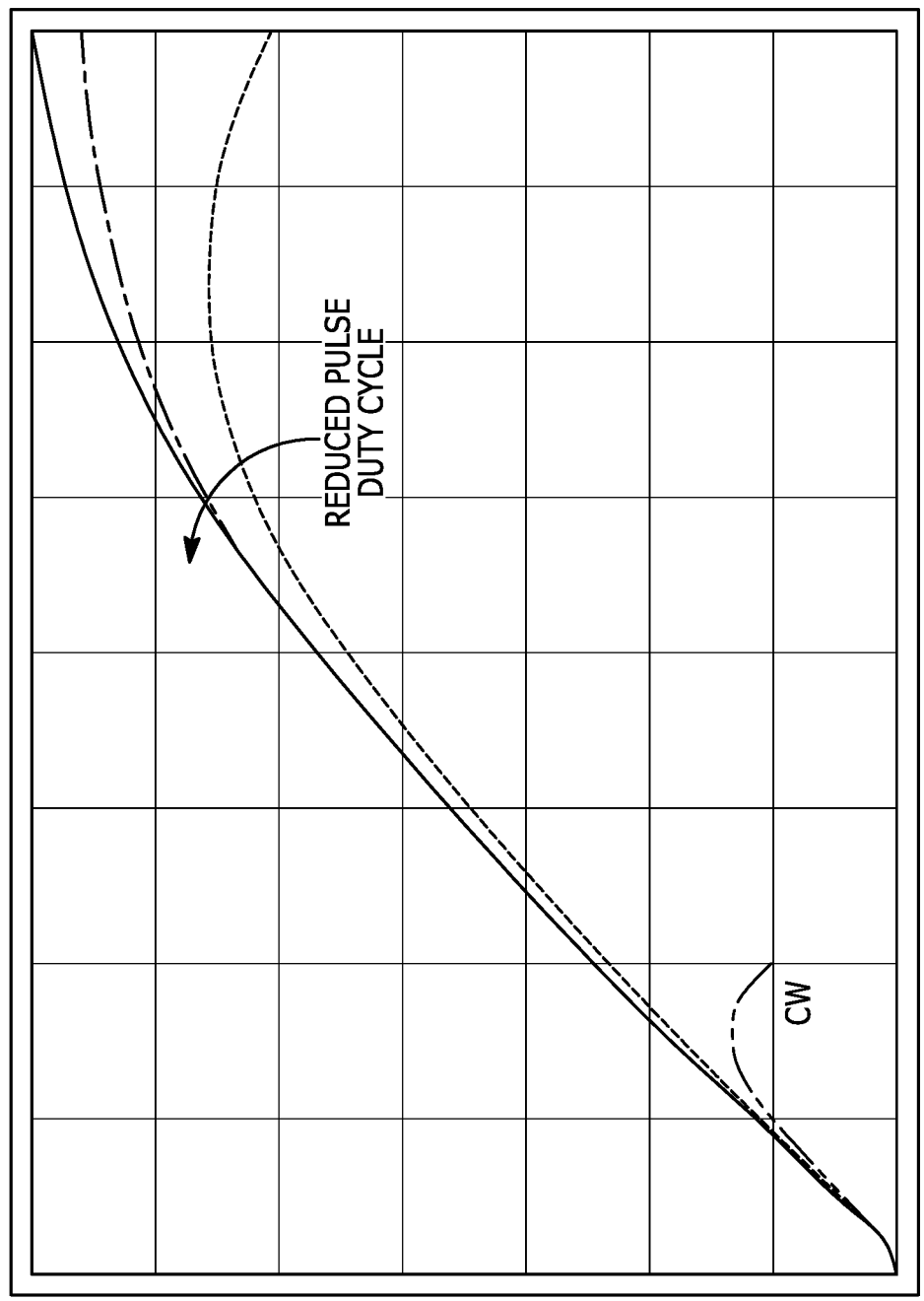
FIG. 6 illustrates a graph of the optical power versus duty cycle for a VCSEL laser under pulsed conditions.

One feature of the present teaching is that the physical architecture of the LIDAR and the control of those elements can provide control over the maximum range and the precision of the range measurement. FIG. 6 illustrates a graph 600 showing an important relationship between peak optical power and duty cycle for a laser operated with very short duration pulses, as is the case for a LIDAR system. The graph 600 shows peak optical power as function of pulse bias current for a VCSEL emitter. To maximize range and minimize range ambiguity, the laser pulse in a pulsed TOF LIDAR system is typically less than 10 nsec in duration. The physics of the laser are such that heat does not have time to dissipate during such a short duration pulse, and so higher optical powers are obtained with lower duty cycle. A typical behavior is shown in the graph 600, where it can be seen that the linear portion of the CW curve can extend much further with long duty cycles. A LIDAR system might operate with <0.1% duty cycle in order to obtain maximize the peak power from the laser. For a 10 nsec pulse duration, 0.1% duty cycle would correspond to 10 µsec duration between pulses.

Thus, laser peak powers, pulse duration and pulse duty cycle are constrained based on both eye safety and thermal dissipation considerations. Range and range ambiguity is another consideration. It is clear that in order to operate a laser at the maximum power possible, that eye safety and pulse duty cycle can put a constraint on the time between pulses, and this time might be longer than desired for the range of the system. For example, a LIDAR system where the maximum range was 150 meters, based only on the TOF, could fire a pulse every one µsec without ambiguity. But, the eye safety and duty cycle constraints might restrict that this laser can only be fire every 5 to 10 µsec. In order to be able to average multiple pulses, the pulses should be close in time. If objects are traveling at a relative velocity of 50 m/sec, their distance will change by 5 mm within 100 µsec. Thus, to not have ambiguity about the target distance and the target itself, a system should complete all pulse averaging where the scene is quasi-stationary and the total time between all pulses is on the order of 100 µsec. Certainly, there is interplay between these various constraints, however, it is clear that based on particular desired performance, specific physical architectures and control schemes can be combined to achieve that performance.

Figure 7:
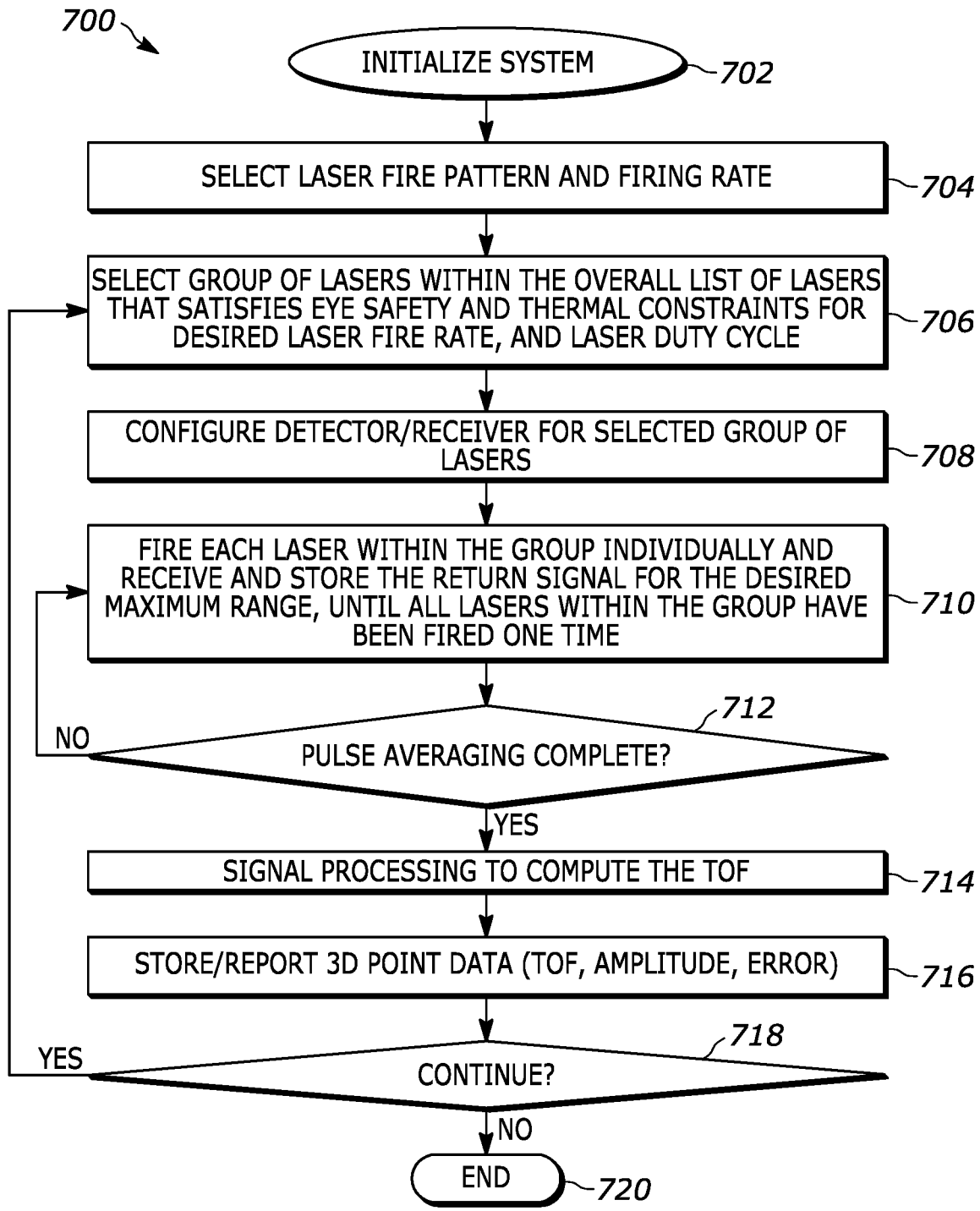
FIG. 7 illustrates a flow diagram for an embodiment of a method of operating a LIDAR system that enables pulse averaging, with consideration for eye safety and thermal constraints on an individual lasers duty cycle.

A solid-state LIDAR system of the present teaching maximizes the possible measurement rate, and enables pulse averaging by following the flow diagram shown in FIG. 7. A method for forming a group or subset of lasers is used, where the firing rate of individual lasers is constrained by the eye safety and/or pulse duty cycle, but the lasers are fired sequentially within the group to maintain the overall desired measurement rate. For example, if the desired measurement rate is 1 µsec and the firing of an individual laser is constrained to 5 µsec, then a group of 5 lasers (A,B,C,D,E) is formed, and the lasers are fired in sequence A-B-C-D-E, and this sequence is repeated for the number of pulse averages desired.

FIG. 7 illustrates a flow diagram 700 for a method of operating a LIDAR system that enables pulse averaging, with consideration for eye safety and thermal constraints on an individual lasers duty cycle. In a first step 702, the system is initialized. This initialization may include, for example, using preset information and/or test measurements to help configure the control schemes. The control scheme configuration includes, for example, determining constraints on laser powers, pulse durations duty cycles, individual laser and detector positions, detector sensitivities, cross talk, and/or optical beam profiles. This information is then used to inform later steps of the method. Once the system is initialized, in step two 704, a laser fire pattern and firing rate is established. In some embodiments, a detection event sequence (detector position, and detection duration and duty cycle) and measurement method (averaging repeat time, etc.) is established. In the embodiment of FIG. 7, in step three 706, the system picks a group of lasers from the overall list of lasers that satisfy the desired constraints on the individual laser firing rate. In step four 708, a detector event sequence is also determined and/or the particular pulse average number is established.

The system then moves to fire each laser within the group individually and receive and store the return signal for the desired maximum range, until all lasers within the group have been fired one time. Specifically, in step five 710, each laser from the selected group is fired in the selected sequence, and the detection event from the firing of each laser is recorded. In step six 712, the controller determines if the pulse average number has been reached. If not, the system returns to step five 710. The firing sequence is repeated until decision step six 712 reaches the desired number of pulse averages. The recorded data from each firing can either be averaged or stored as a sequential histogram. In step seven 714, signal processing is performed in a processor that computes the TOF based on the average and/or the histogram of the data from each individual laser. In step eight 716, the processor determines and stores and/or reports 3D point data in the form of TOF, amplitude and error. In step nine 718, the system decides whether to continue back to step three 706, and move to a new group or end. If not continue the method ends at step ten 720. Completion of all lasers within the firing list, represents completion of one full frame.

This is only one possible flow chart, and presented as an example only. Additional operational flows are also possible. In some systems, for example, the data from every pulse might not only be recorded but also be communicated externally and/or intermediate TOF information might be calculated depending on the system requirements. Error handling, pulse coding, and/or more complicated digital signal processing are possible instead of simple pulse averaging or histogramming of the data.

Figure 8:
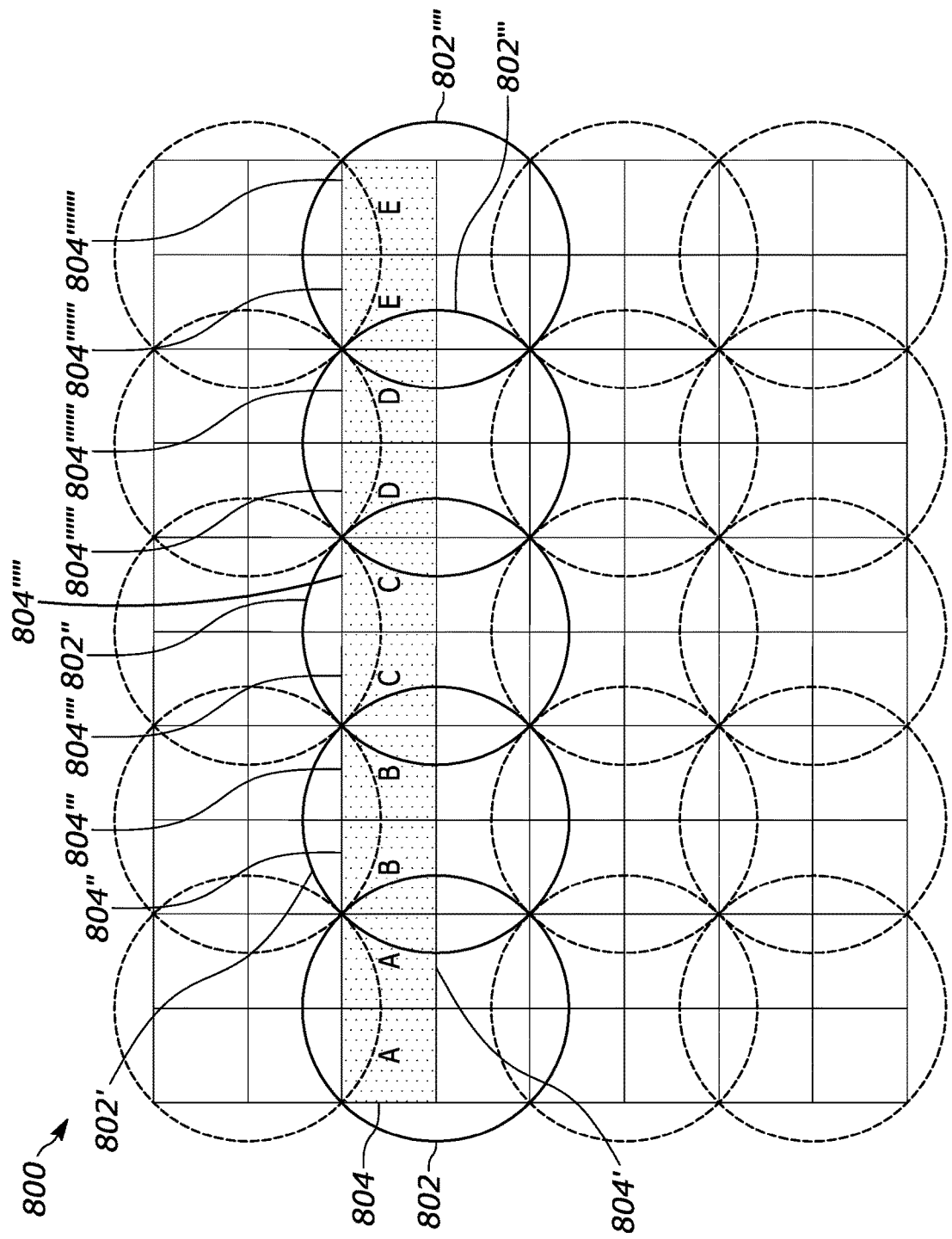
FIG. 8 illustrates a two-dimensional projection of the system Field-of-View (FOV) of the LIDAR system configuration for an embodiment where one row of the detector array is used to acquire multiple measurements while the scene is quasi-static.

FIG. 8 is provided to show an additional illustration of the process outlined in FIG. 7. In particular, FIG. 8 illustrates a two-dimensional projection of the system Field-of-View (FOV) 800 of the LIDAR system configuration for an embodiment where one row of the detector array is used to acquire multiple measurements while the scene is quasi-static. In this embodiment, there are five lasers that overlap to cover all ten detectors. There are five corresponding laser FOVs 802, 802', 802", 802''', and 802''''. There are ten detector FOVs 804, 804', 804", 804''', 804'''', 804''''', 804'''''', 804''''''', 804'''''''', 804'''''''''.

This configuration utilizes a firing sequence of the lasers indicated by the letters (A,B,C,D,E). Thus, the laser that generates FOV 802 is fired, then the laser that generates FOV 802' is fired, then the laser that generates FOV 802" is fired, then the laser that generates FOV 802''' is fired, and then the laser that generates FOV 802'''' is fired. In each case, the FOV of one laser illuminates the FOV of two detectors within the corresponding row. In other words, in one example, the FOV 802 illuminates detector FOV 804, 804'.

To satisfy eye safety and/or thermal constraints, a specific sequence for firing these lasers might be required, for example, A then C then E then B then D. The sequence A-C-E-B-D is then repeated to obtain multiple measurements for averaging or histogramming to improve SNR. Notice that in this sequence, no set of detectors are immediately adjacent to the previous set of detectors, which means there is a gap in the FOV for the corresponding lasers. For instance, the detectors marked A, resulting in detector FOV 804, 804', are not immediately adjacent to the detectors marked C, resulting in detector FOV 804''', 804''''. This is likely beneficial for eye safety by insuring no FOV overlap between the transmitted laser beams.

The duration of the time during which the measurements are obtained is on the order of 100 μsec in some specific embodiments so that the scene is quasi-static and no object in the scene can move more than a few mm in position. The other detector rows in the LIDAR system in FIG. 8 would be operated in a similar manner, in order to measure the full field of view. The embodiment in FIG. 8 is simple for ease of illustration with few lasers and few detectors, whereas it can be understood that in an actual system there would likely be larger numbers of lasers and detectors.

Figure 9:
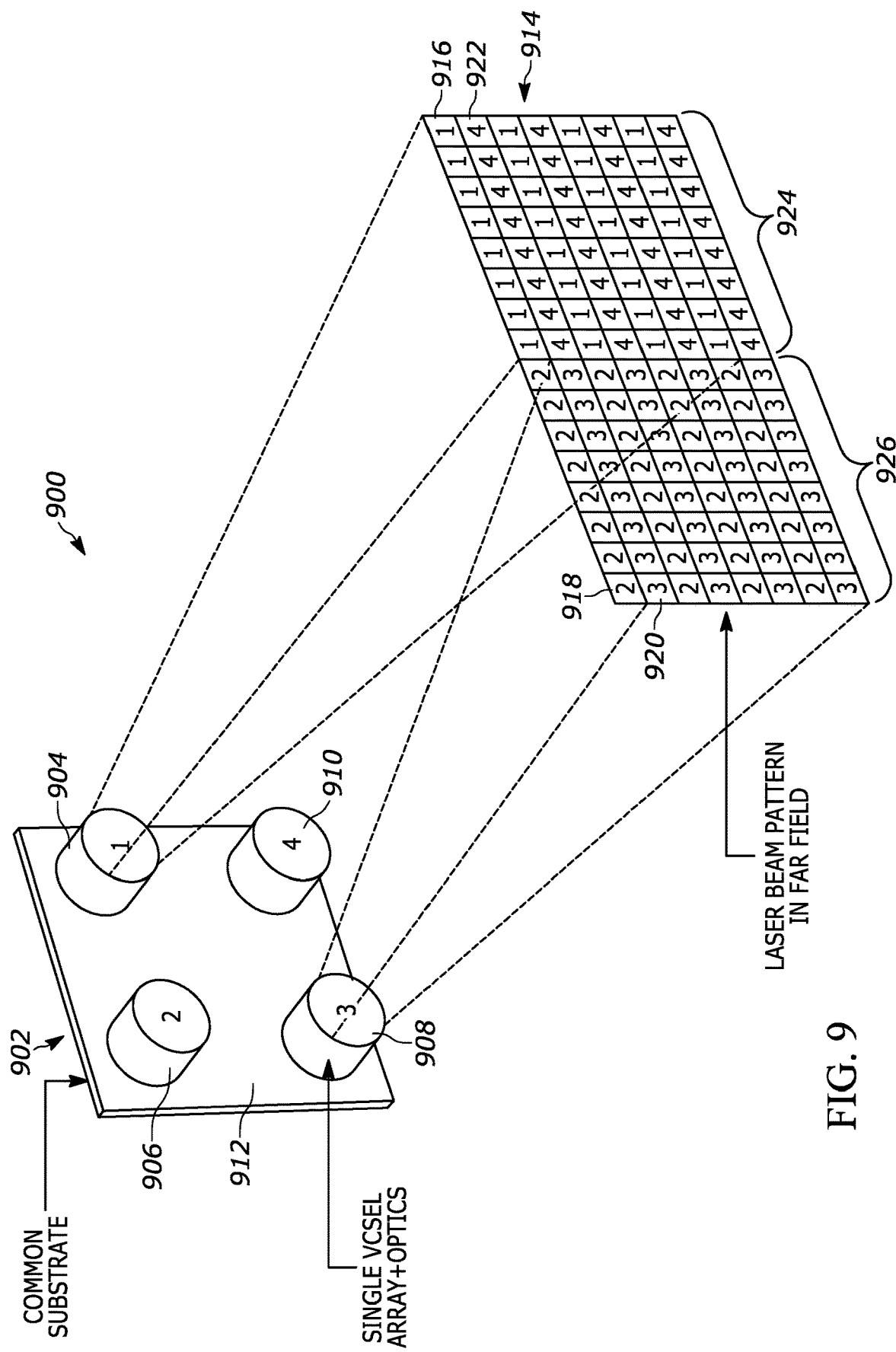
FIG. 9 illustrates an embodiment of a portion of a LIDAR system of the present teaching in which the transmitter is configured using four VCSEL array assemblies that include optics and are arranged on a common substrate.

FIG. 9 illustrates an embodiment of a portion of a LIDAR system 900 of the present teaching in which the transmitter 902 is configured using four VCSEL array assemblies 904, 906, 908, 910 that include optics and are arranged on a common substrate 912. The four VCSEL array assemblies 904, 906, 908, 910, each including corresponding optics are arranged in a square pattern on the common substrate 912. Each of the VCSELs in the VCSEL array assemblies 904, 906, 908, 910 in this embodiment has thirty-two individual lasers which can be fired independently. The VCSEL array assemblies 904, 906, 908, 910 are labeled assembly 1, 904, assembly 2, 906, assembly 3, 908 and assembly 4, 910. Individual optical beams for the individual lasers in the VCSEL arrays associated with each VCSEL array assembly 904, 906, 908, 910 are projected into the far field so that they interleave in a set pattern that is determined by the spacing of the elements in the arrays, by the spacing of the VCSEL arrays, and by the projection optics.

The laser beam pattern in the far field 914 illustrates how optical beams from individual lasers in the various arrays appear. This pattern in the far field 914 is the pattern of the laser optical beam FOV as described herein. FOVs for lasers from assembly 1, 904, are denoted by a 1 in the FOV as shown in square 916. FOVs for lasers from assembly 2, 906, are denoted by a 2 in the FOV as shown in square 918. FOVs for lasers from assembly 3, 908, are denoted by a 3 in the FOV as shown in square 920. FOVs for lasers from assembly 4, 910, are denoted by a 4 in the FOV as shown in square 922. While the FOVs are illustrated as square, the shape can be a variety of shapes based, for example, on the emitter shape and projection optics.

In various embodiments, the laser beam patterns from each array can be arranged in a variety of patterns. In the embodiment of the LIDAR system 900, FOVs 916, 922 of laser arrays (1,4) 904, 910 are overlapping in free space, FOVs 918, 920 of laser arrays (2,3) 906, 908 are also overlapping, and the two sets of patterns (1,4) 924 and (2,3) 926 are placed side by side. The illustration of LIDAR system 900 is not to scale and does not illustrate all the components, but is rather intended to illustrate the concept of the generation of laser FOV patterns at a target range. Thus, the far-field pattern 914 at a particular target plane is not to scale, and will change as a function of distance. In operation, individual lasers in each array assembly 904, 906, 908, 910 can be fired independently as described herein. In various embodiments, the firing rate may be determined by meeting desired eye safety thresholds, and/or thermal considerations.

The wavelengths of the VCEL arrays in array assemblies 904, 906, 908, 910 are not necessarily the same. In some embodiments, wavelengths lasers in arrays (1,4), 904, 910 and (2,3) 906, 908 might be different wavelengths, producing a side-by-side pattern. This wavelength arrangement might be beneficial in order to minimize the possibility of optical cross-talk between the two sets of lasers at a receiver (not shown). Or, alternatively, lasers in arrays (1,2) 904, 906 might be the same wavelength while lasers in arrays (3,4) 908, 910 are a different wavelength, producing an interleaved pattern. This wavelength arrangement would allow for some level of redundancy and parallel operation across the full field of view. By placing the array assemblies 904, 906, 908, 910 in physically separate locations on substrate 912 there is more flexibility to meet the Class 1 eye safety while maintaining a high pulse fire rate, since the beams from each array do not overlap in the near field.

EQUIVALENTS

While the Applicant's teaching is described in conjunction with various embodiments, it is not intended that the Applicant's teaching be limited to such embodiments. On the contrary, the Applicant's teaching encompasses various alternatives, modifications, and equivalents, as will be appreciated by those of skill in the art, which may be made therein without departing from the spirit and scope of the teaching.

What is claimed is:

1. A solid-state Light Detection and Ranging (LIDAR) system comprising:
    a) a plurality of lasers, each of the plurality of lasers generating an optical beam having a Field of View (FOV) when energized;
    b) a plurality of detectors positioned in an optical path of the optical beams generated by the plurality of lasers, each of the plurality of detectors having a detector signal output, wherein a FOV of at least one of the plurality of optical beams generated by the plurality of lasers overlaps a FOV of at least two of the plurality of detectors; and
    c) a controller having a plurality of laser control outputs and a plurality of detector inputs, each of the plurality of laser control outputs being electrically connected to a bias input of one of the plurality of lasers and each of the plurality of detector inputs being electrically connected to the detector signal output of one of the plurality of detectors, the controller being configured to generate bias signals at the plurality of laser control outputs that energize a selected group of the plurality of lasers in a predetermined time sequence that is selected to maintain eye safe conditions, and being configured to detect a predetermined sequence of detector signals generated by the plurality of detectors that is chosen to provide a desired measurement resolution.

2. The solid-state LIDAR system of claim 1 wherein at least some of the plurality of lasers comprise vertical cavity surface emitting lasers.

3. The solid-state LIDAR system of claim 1 wherein at least some of the plurality of lasers emit laser light at different wavelengths.

4. The solid-state LIDAR system of claim 1 wherein the plurality of lasers comprises a two-dimensional array of lasers.

5. The solid-state LIDAR system of claim 4 wherein one row of the two-dimensional array of lasers emits laser light at one wavelength when energized by the controller and another row of the two-dimensional array of lasers emits laser light at a second wavelength when energized by the controller.

6. The solid-state LIDAR system of claim 4 wherein the selected group of the plurality of lasers comprises a row of the two-dimensional array.

7. The solid-state LIDAR system of claim 4 wherein the selected group of the plurality of lasers comprises a column of the two-dimensional array.

8. The solid-state LIDAR system of claim 1 wherein the plurality of detectors comprises a two-dimensional array of detectors.

9. The solid-state LIDAR system of claim 8 wherein the controller is configured to sequentially sample detector signals from one row of the two-dimensional array of detectors.

10. The solid-state LIDAR system of claim 8 wherein the controller is configured to sequentially sample detector signals from one column of the two-dimensional array of detectors.

11. The solid-state LIDAR system of claim 1 wherein the controller is further configured to repeat the generation of the bias signals at the plurality of laser control outputs that energize the selected group of the plurality of lasers in the predetermined time sequence a plurality of times.

12. The solid-state LIDAR system of claim 1 wherein the controller is configured to detect a predetermined sequence of detector signals generated by the plurality of detectors in a sequence that is repeated a plurality of times.

13. The solid-state LIDAR system of claim 1 wherein the controller is configured to generate bias signals at the plurality of laser control outputs that energize a selected group of the plurality of lasers with different wavelengths in the predetermined time sequence.

14. The solid-state LIDAR system of claim 1 wherein the controller is configured to generate bias signals at the plurality of laser control outputs that energize a selected group of the plurality of lasers to emit light in a predetermined pattern.

15. The solid-state LIDAR system of claim 14 wherein the controller is configured to detect a predetermined sequence of detector signals generated by the plurality of detectors corresponding to the predetermined pattern of light emitted from the plurality of lasers.

16. The solid-state LIDAR system of claim 1 wherein the controller is configured to generate bias signals at the plurality of laser control outputs that energize the selected group of the plurality of lasers to emit light in a predetermined pattern that maintains Class 1 eye safe optical power levels in the predetermined pattern.

17. The solid-state LIDAR system of claim 1 wherein the controller is configured to generate bias signals at the plurality of laser control outputs that energize the selected group of the plurality of lasers to maintain a predetermined thermal dissipation.

18. The solid-state LIDAR system of claim 1 wherein the controller is configured to detect a predetermined sequence of detector signals generated by detectors that are positioned in a region that is illuminated by a single laser beam FOV.

19. The solid-state LIDAR system of claim 18 wherein the detectors that are positioned in the region that is illuminated by the single laser beam FOV includes all detectors that are illuminated by the single laser beam FOV.

20. The solid-state LIDAR system of claim 18 wherein the detectors that are positioned in the region that is illuminated by the single laser beam FOV includes a subset of detectors that are illuminated by the single laser beam FOV.

21. The solid-state LIDAR system of claim 20 wherein the subset of detectors comprises detectors forming a shape that provides a desired angular resolution for a particular measurement.

22. A method of Light Detection and Ranging (LIDAR), the method comprising:
  a) energizing a selected group of a plurality of lasers in a predetermined time sequence to generate an optical beam having a Field-of-View (FOV), wherein the predetermined time sequence is selected to maintain eye safe conditions; and
  b) detecting in a predetermined time sequence the optical beam generated by the selected group of the plurality of lasers with a plurality of detectors, wherein the FOV of the optical beam generated by the selected group of the plurality of lasers overlaps a FOV of at least two of the plurality of detectors, and wherein a number and a position of the plurality of detectors is chosen to provide a desired measurement resolution.

23. The method of claim 22 wherein the selected group of the plurality of lasers is chosen to limit operating temperatures of the plurality of lasers to below a predetermined temperature.

24. The method of claim 22 wherein the energizing the selected group of the plurality of lasers comprises energizing at least some of the plurality of lasers with a different emission wavelength.

25. The method of claim 22 wherein the energizing the selected group of the plurality of lasers comprises energizing a two-dimensional array of lasers.

26. The method of claim 25 wherein lasers in a first row of the two-dimensional array of lasers emit laser light at a first wavelength and lasers in a second row of the two-dimensional array of lasers emit light at a different wavelength from the first wavelength.

27. The method of claim 22 wherein the energizing the selected group of the plurality of lasers comprises energizing a subset of a two-dimensional array of lasers.

28. The method of claim 22 wherein the energizing the selected group of the plurality of lasers comprises energizing a row of a two-dimensional array of lasers.

29. The method of claim 22 wherein the energizing the selected group of the plurality of lasers comprises energizing a column of a two-dimensional array of lasers.

30. The method of claim 22 wherein the detecting in the predetermined time sequence the optical beam generated by the selected group of the plurality of lasers with the plurality of detectors is repeated a plurality of times.

31. The method of claim 22 wherein the energizing the selected group of the plurality of lasers in the predetermined time sequence is repeated a plurality of times.

32. The method of claim 22 wherein the energizing the selected group of the plurality of lasers in the predetermined time sequence comprises energizing a selected group of the plurality of lasers to emit light in a predetermined pattern.

33. The method of claim 22 wherein the energizing the selected group of the plurality of lasers in the predetermined time sequence comprises energizing a selected group of the plurality of lasers to maintain a predetermined thermal dissipation.

34. The method of claim 22 wherein the detecting in the predetermined time sequence of the optical beam generated by the selected group of the plurality of lasers with the plurality of detectors comprises detecting a single optical beam.

35. The method of claim 22 wherein the detecting in the predetermined time sequence of the optical beam generated by the selected group of the plurality of lasers with the plurality of detectors comprises detecting in a region that provides a desired angular resolution for a particular measurement.

36. A solid-state Light Detection and Ranging (LIDAR) system comprising:
  a) a plurality of lasers, each of the plurality of lasers generating an optical beam having a Field of View (FOV) when energized;
  b) a plurality of detectors positioned in an optical path of the optical beams generated by the plurality of lasers, each of the plurality of detectors having a detector signal output, wherein a FOV of at least one of the plurality of optical beams generated by the plurality of lasers overlaps a FOV of at least two of the plurality of detectors; and
  c) a controller having a plurality of laser control outputs and a plurality of detector inputs, each of the plurality of laser control outputs being electrically connected to a bias input of one of the plurality of lasers and each of the plurality of detector inputs being electrically connected to the detector signal output of one of the plurality of detectors, the controller being configured to generate bias signals at the plurality of laser control outputs that energize a selected group of the plurality of lasers in a predetermined time sequence that is selected to maintain predetermined thermal conditions, and being configured to detect a predetermined sequence of detector signals generated by the plurality of detectors that is chosen to provide a desired measurement resolution.

37. The solid-state LIDAR system of claim 36 wherein at least some of the plurality of lasers comprise vertical cavity surface emitting lasers.

38. The solid-state LIDAR system of claim 36 wherein at least some of the plurality of lasers emit laser light at different wavelengths.

39. The solid-state LIDAR system of claim 36 wherein the plurality of lasers comprises a two-dimensional array of lasers.

40. The solid-state LIDAR system of claim 39 wherein one row of the two-dimensional array of lasers emits laser light at one wavelength when energized by the controller and another row of the two-dimensional array of lasers emits laser light at a different wavelength when energized by the controller.

41. The solid-state LIDAR system of claim 39 wherein the selected group of the plurality of lasers comprises a row of the two-dimensional array.

42. The solid-state LIDAR system of claim 39 wherein the selected group of the plurality of lasers comprises a column of the two-dimensional array.

43. The solid-state LIDAR system of claim 36 wherein the plurality of detectors comprises a two-dimensional array of detectors.

44. The solid-state LIDAR system of claim 43 wherein the controller is configured to sequentially sample detector signals from one row of the two-dimensional array of detectors.

45. The solid-state LIDAR system of claim 43 wherein the controller is configured to sequentially sample detector signals from one column of the two-dimensional array of detectors.

46. The solid-state LIDAR system of claim 36 wherein the controller is further configured to repeat the generation of the bias signals at the plurality of laser control outputs that energize the selected group of the plurality of lasers in the predetermined time sequence a plurality of times.

47. The solid-state LIDAR system of claim 36 wherein the controller is configured to detect a predetermined sequence of detector signals generated by the plurality of detectors in a sequence that is repeated a plurality of times.

48. The solid-state LIDAR system of claim 36 wherein the controller is configured to generate bias signals at the plurality of laser control outputs that energize a selected group of the plurality of lasers with different wavelengths in the predetermined time sequence.

49. The solid-state LIDAR system of claim 36 wherein the controller is configured to generate bias signals at the plurality of laser control outputs that energize a selected group of the plurality of lasers to emit light in a predetermined pattern.

50. The solid-state LIDAR system of claim 49 wherein the controller is configured to detect a predetermined sequence of detector signals generated by the plurality of detectors corresponding to the particular predetermined pattern of light emitted from the plurality of lasers.

51. The solid-state LIDAR system of claim 36 wherein the controller is configured to generate bias signals at the plurality of laser control outputs that energize the selected group of the plurality of lasers to emit light in a predetermined pattern that maintains Class 1 eye safe optical power levels in the pattern.

52. The solid-state LIDAR system of claim 36 wherein the controller is configured to generate bias signals at the plurality of laser control outputs that energize the selected group of the plurality of lasers to maintain eye safe conditions.

53. The solid-state LIDAR system of claim 36 wherein the controller is configured to detect a predetermined sequence of detector signals generated by detectors that are positioned in a region that is illuminated by a single laser beam FOV.

54. The solid-state LIDAR system of claim 53 wherein the detectors that are positioned in the region that is illuminated by the single laser beam FOV includes all detectors that are illuminated by the single laser beam FOV.

55. The solid-state LIDAR system of claim 53 wherein the detectors that are positioned in the region that is illuminated by the single laser beam FOV includes a subset of detectors that are illuminated by the single laser beam FOV.

56. The solid-state LIDAR system of claim 55 wherein the subset of detectors comprises detectors forming a shape that provides a desired angular resolution for a particular measurement.

* * * * *